U S 012232255B2

(12) United States Patent
Kim et al.

(10) Patent No.: US 12,232,255 B2
(45) Date of Patent: Feb. 18, 2025

(54) CIRCUIT BOARD

(71) Applicant: LG INNOTEK CO., LTD., Seoul (KR)

(72) Inventors: Yong Suk Kim, Seoul (KR); Jeong Han Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 233 days.

(21) Appl. No.: 18/011,293

(22) PCT Filed: Jun. 17, 2021

(86) PCT No.: PCT/KR2021/007600
§ 371 (c)(1),
(2) Date: Dec. 19, 2022

(87) PCT Pub. No.: WO2021/256869
PCT Pub. Date: Dec. 23, 2021

(65) Prior Publication Data
US 2023/0269872 A1 Aug. 24, 2023

(30) Foreign Application Priority Data
Jun. 17, 2020 (KR) .................. 10-2020-0073583

(51) Int. Cl.
*H05K 1/00* (2006.01)
*H05K 1/03* (2006.01)
(Continued)

(52) U.S. Cl.
CPC ........... *H05K 1/0306* (2013.01); *H05K 1/056* (2013.01); *H05K 1/115* (2013.01)

(58) Field of Classification Search
CPC ....... H05K 1/0306; H05K 1/056; H05K 1/115
See application file for complete search history.

(56) References Cited

U.S. PATENT DOCUMENTS

2014/0104798 A1 4/2014 Park et al.
2015/0060115 A1 3/2015 Lee et al.
(Continued)

FOREIGN PATENT DOCUMENTS

JP 2010-010329 1/2010
KR 10-2014-0048563 4/2014
(Continued)

OTHER PUBLICATIONS

International Search Report dated Sep. 29, 2021 issued in Application No. PCT/KR2021/007600.

*Primary Examiner* — Pete T Lee
(74) *Attorney, Agent, or Firm* — KED & ASSOCIATES, LLP

(57) ABSTRACT

A circuit board according to an embodiment includes: an insulating portion including a plurality of insulating layers; a circuit pattern disposed on surfaces of the plurality of insulating layers; and a via passing through at least one insulating layer among the plurality of insulating layers; wherein the insulating portion includes: a first insulating portion including at least one insulating layer; a second insulating portion disposed on the first insulating portion and including a plurality of insulating layers; and a third insulating portion disposed under the first insulating portion and including a plurality of insulating layers; wherein the first insulating portion is formed of prepreg containing glass fibers, wherein at least one of the second insulating portion and the third insulating portion includes a resin coated copper (RCC) and a solder resist disposed on the RCC, wherein the circuit pattern is disposed on a surface of the solder resist, and wherein the via is formed passing through the solder resist.

17 Claims, 11 Drawing Sheets

(51) Int. Cl.
*H05K 1/05* (2006.01)
*H05K 1/11* (2006.01)

(56) References Cited

U.S. PATENT DOCUMENTS

| | | | | |
|---|---|---|---|---|
| 2015/0118509 A1* | 4/2015 | Mizuno | ............... | H05K 1/056 |
| | | | | 174/258 |
| 2016/0293561 A1* | 10/2016 | Kadoguchi | ............ | H01L 24/29 |
| 2019/0006324 A1* | 1/2019 | Migita | ............... | H01L 25/0657 |

FOREIGN PATENT DOCUMENTS

| | | |
|---|---|---|
| KR | 10-2015-0017959 | 2/2015 |
| KR | 10-2015-0025245 | 3/2015 |
| KR | 10-2016-0020407 | 2/2016 |
| KR | 10-2016-0097801 | 8/2016 |
| KR | 10-2018-0036871 | 4/2018 |

\* cited by examiner

【FIG. 1】
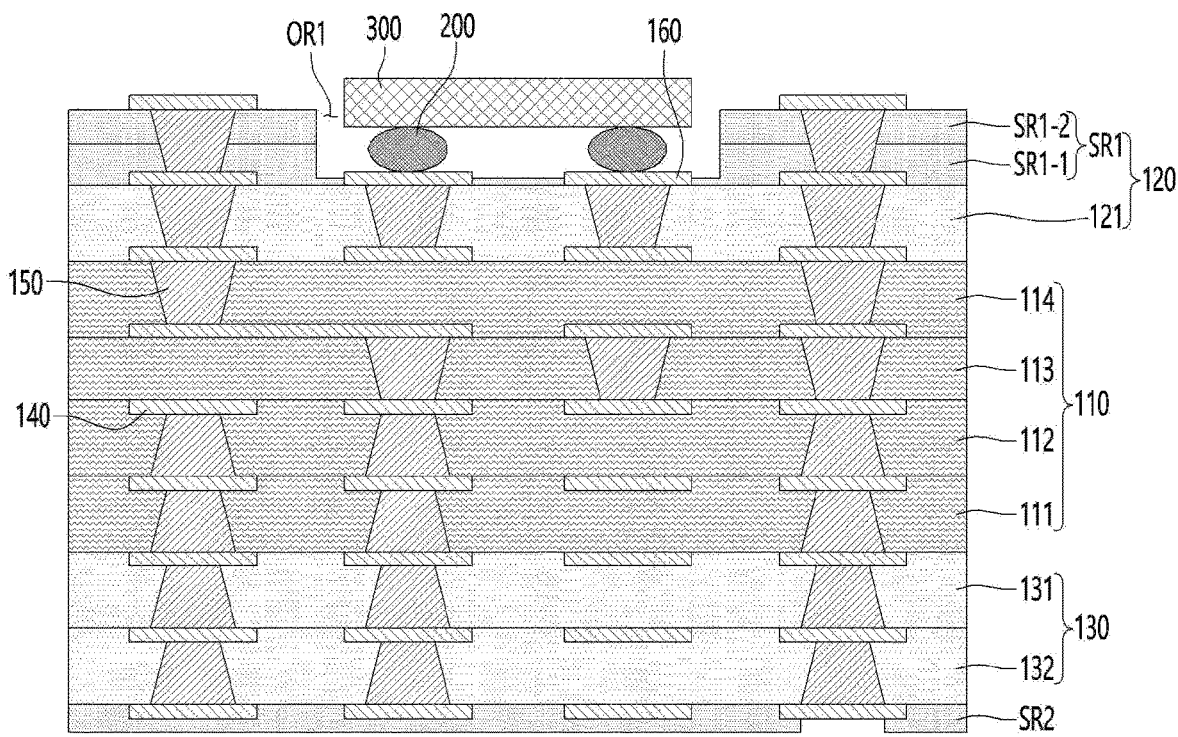
【FIG. 2】
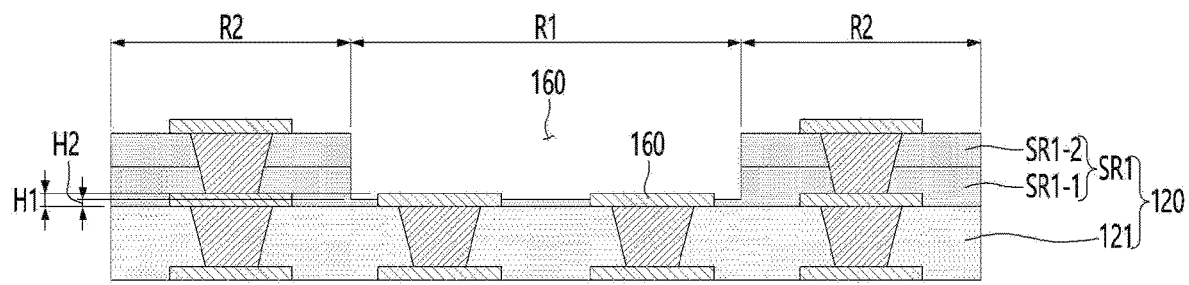

[FIG. 3]
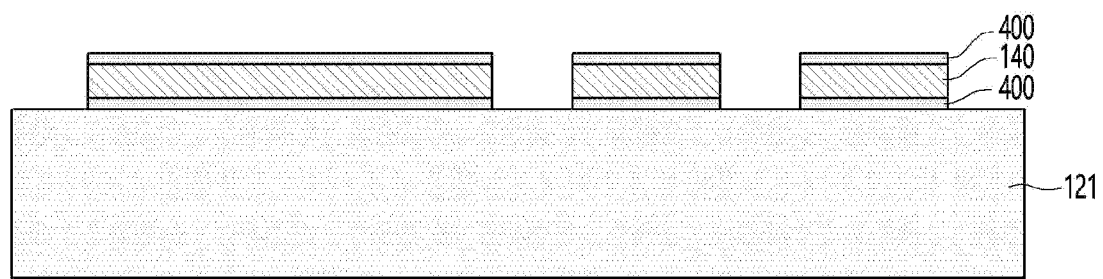
[FIG. 4]
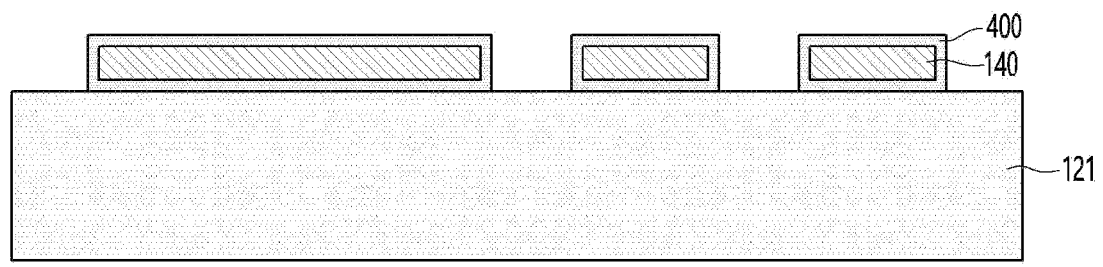
[FIG. 5]
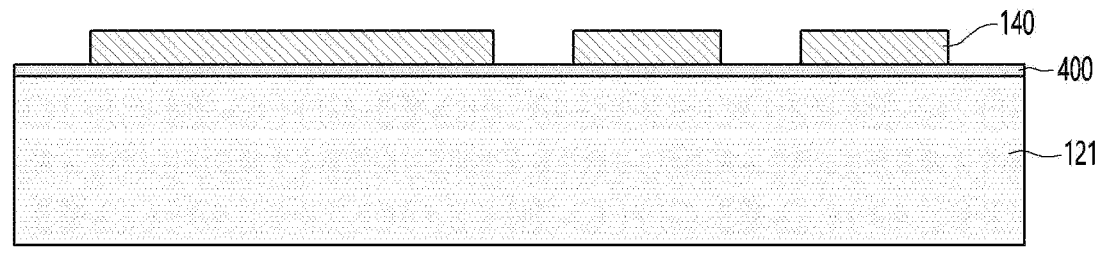

[FIG. 6]
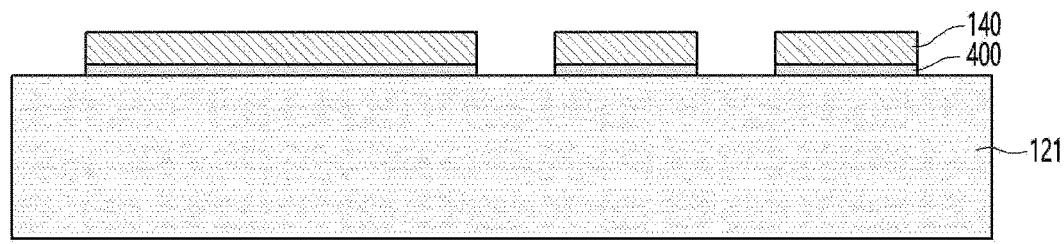
[FIG. 7]
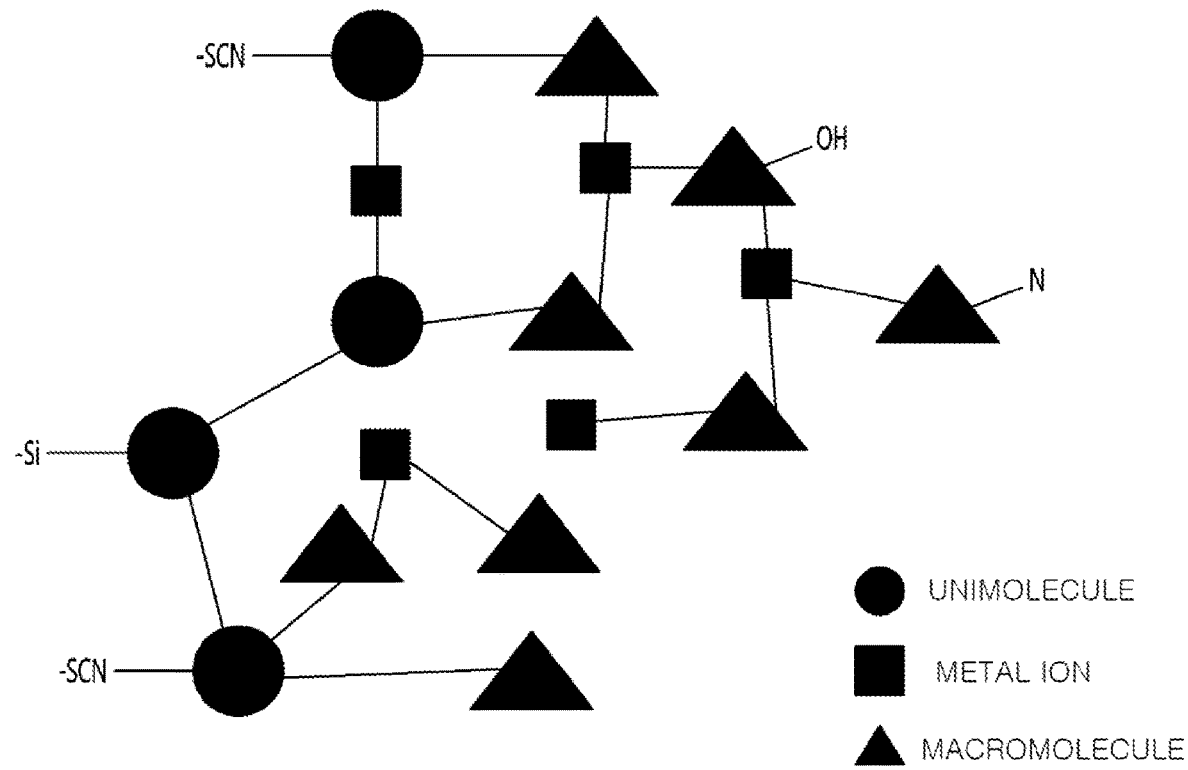

[FIG. 8]
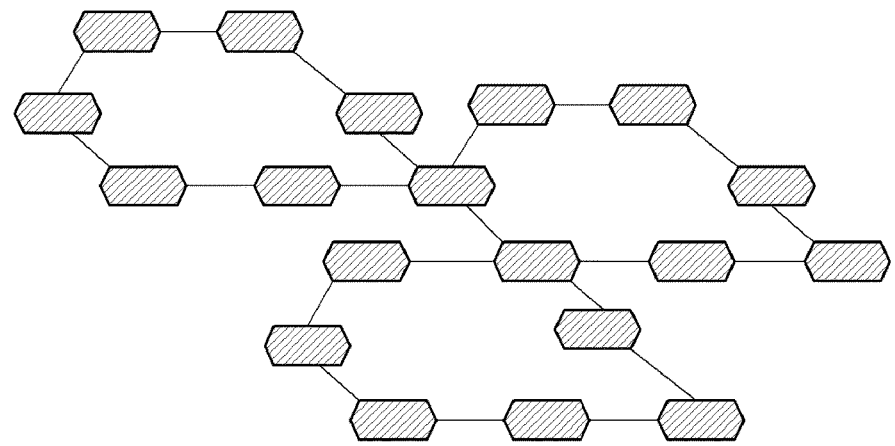
[FIG. 9]
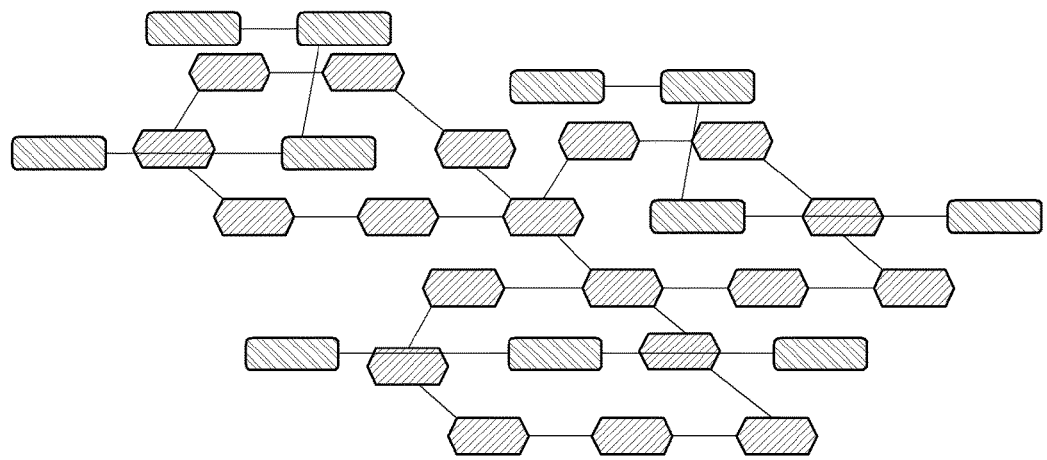

[FIG. 10]
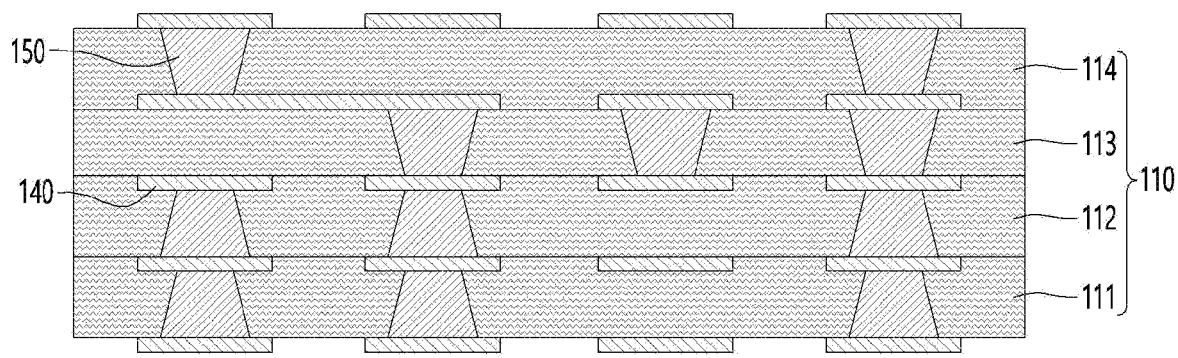
[FIG. 11]
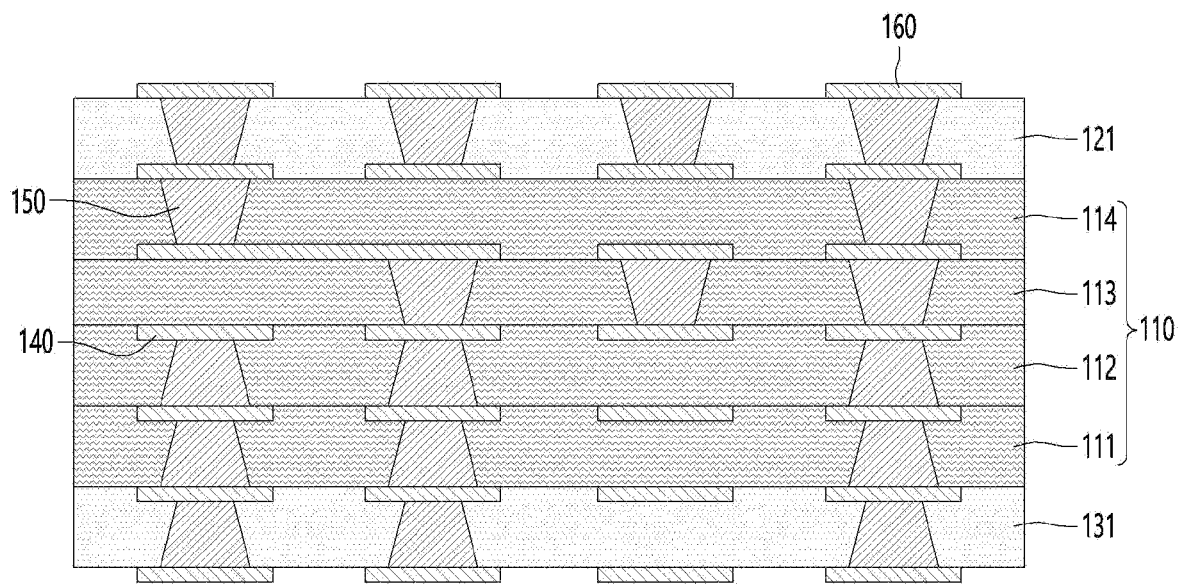

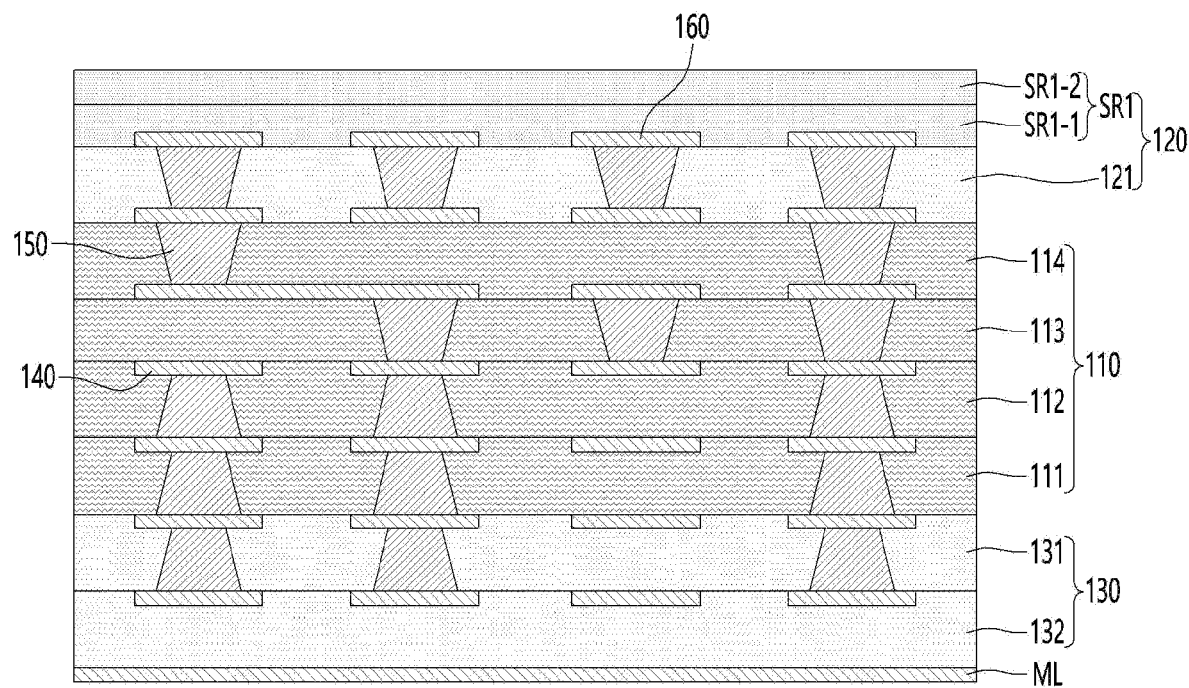
[FIG. 12]

[FIG. 13]
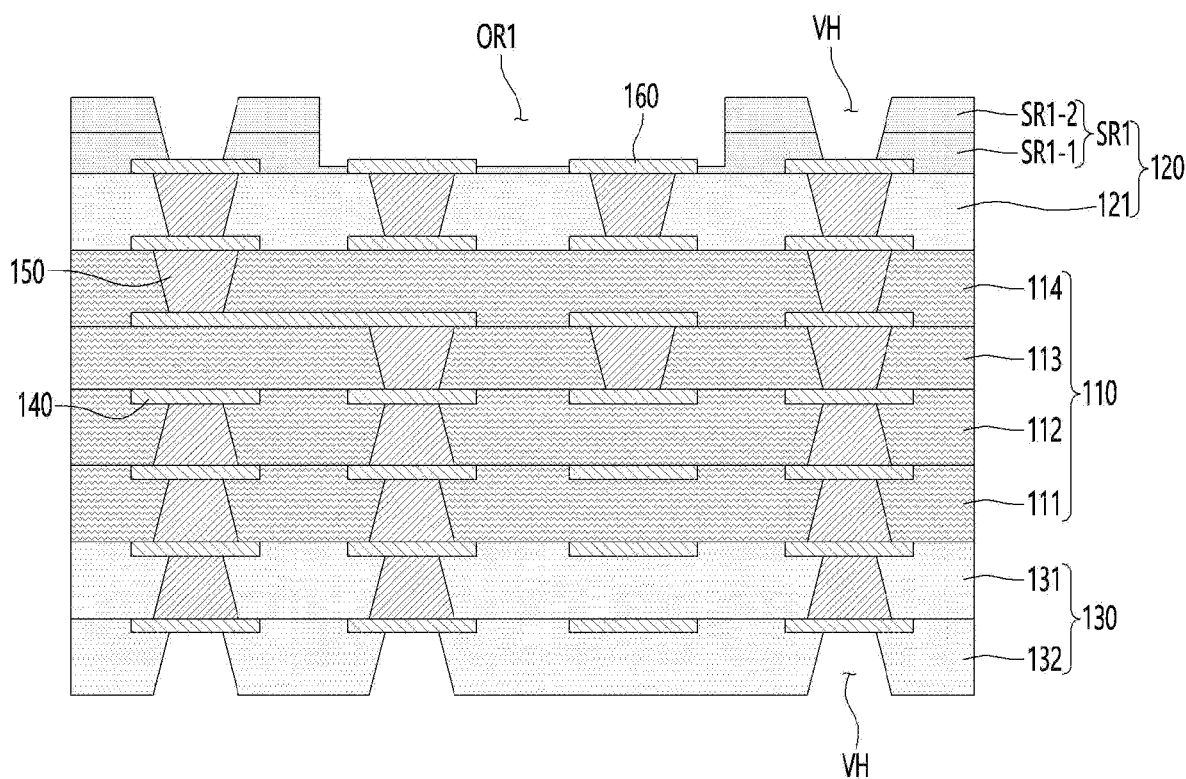

[FIG. 14]
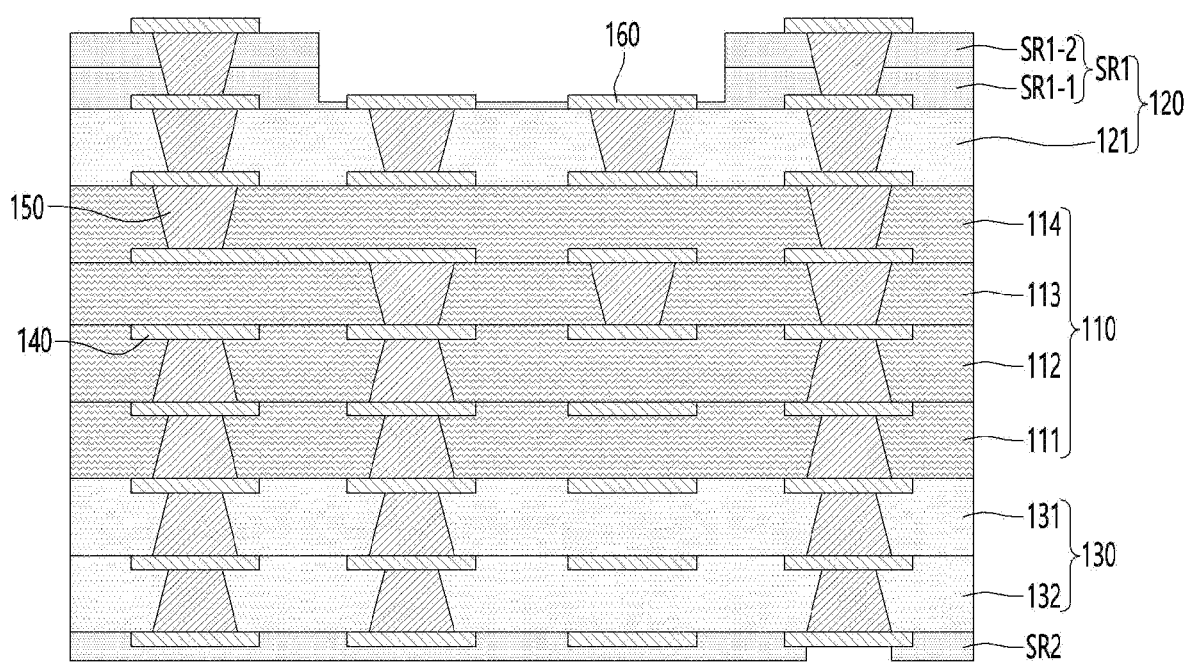

[FIG. 15]
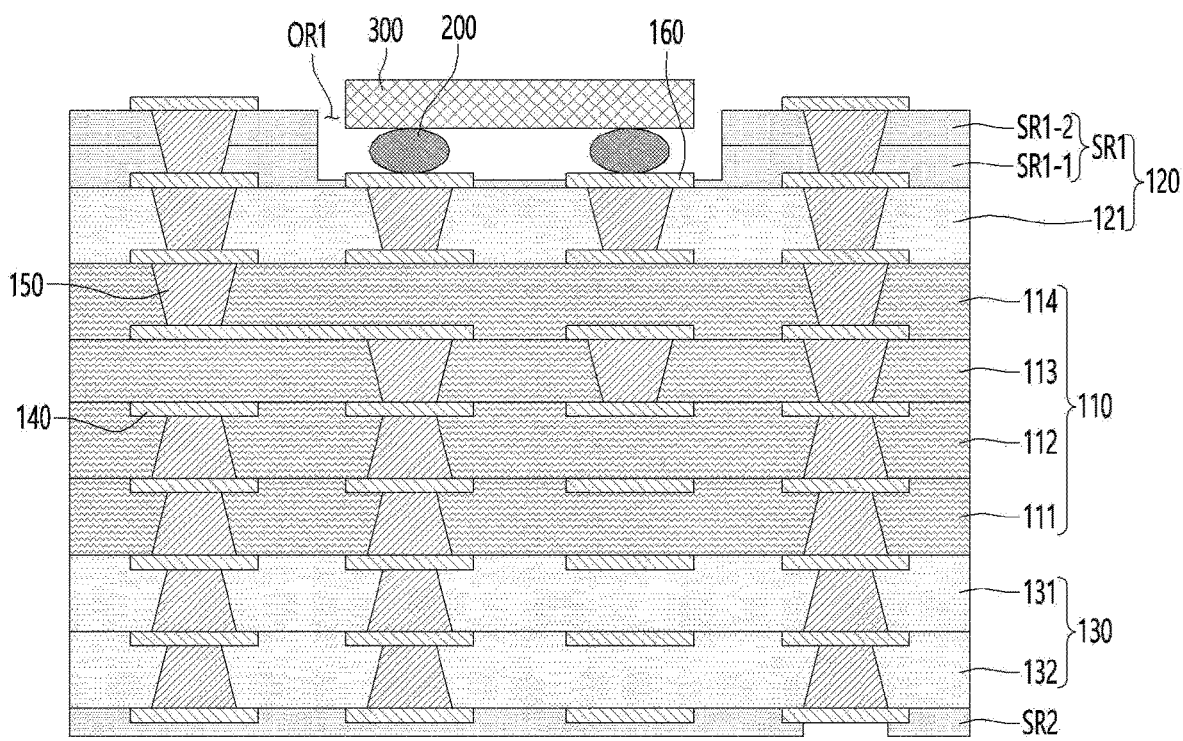

[FIG. 16]
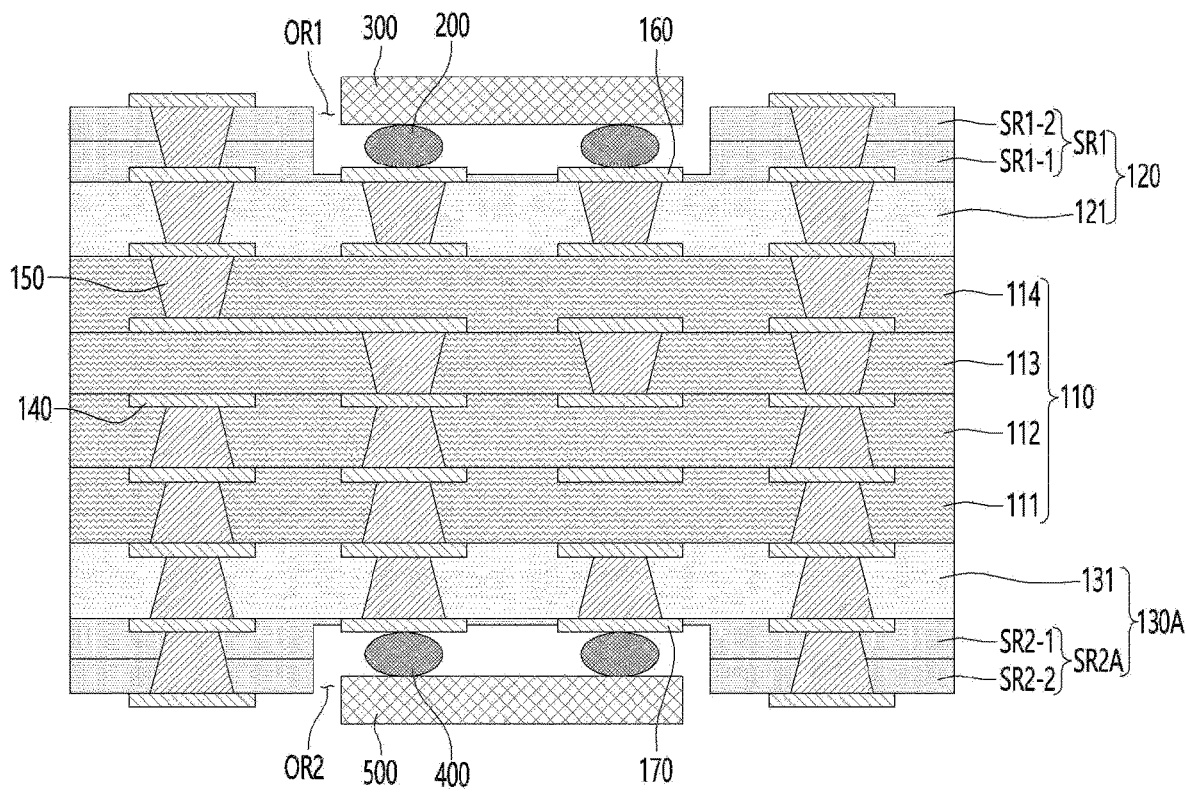

[FIG. 17]
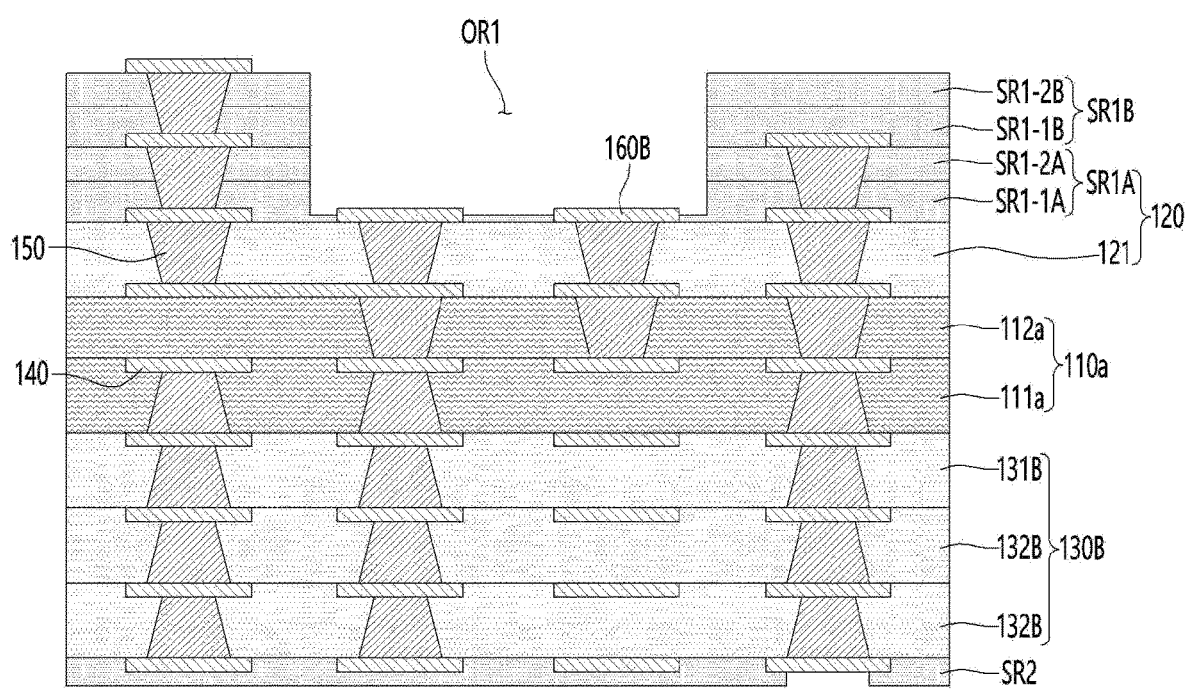

CIRCUIT BOARD

CROSS-REFERENCE TO RELATED PATENT APPLICATIONS

This application is a U.S. National Stage Application under 35 U.S.C. § 371 of PCT Application No. PCT/KR2021/007600, filed Jun. 17, 2021, which claims priority to Korean Patent Application No. 10-2020-0073583, filed Jun. 17, 2020, whose entire disclosures are hereby incorporated by reference.

TECHNICAL FIELD

The embodiment relates to a circuit board, and more particularly, to a circuit board having a laminated structure of prepreg, resin coated copper, and solder resist.

BACKGROUND ART

A printed circuit board (PCB) is formed by printing a circuit line pattern on an electrically insulating substrate with a conductive material such as copper, and refers to a board immediately before mounting electronic components. That is, it refers to a circuit board on which a mounting position of each component is determined and a circuit pattern connecting the components is printed and fixed on a flat surface in order to densely mount many types of electronic devices on a flat surface.

The components mounted on the circuit board may transmit signals generated from the components by a circuit pattern connected to each component.

On the other hand, the signals are becoming higher in frequency in order to process a large amount of information at high speed with the recent high functionality of portable electronic devices, etc. and accordingly, the circuit patterns of circuit boards suitable for high-frequency applications are required.

A reduction in transmission loss is desired in order to enable transmission of such a circuit pattern of a circuit board without degrading the quality of a high-frequency signal.

A transmission loss of a circuit pattern of a circuit board mainly consists of a conductor loss due to a metal thin film such as copper and a dielectric loss due to a dielectric material such as an insulating layer.

The conductor loss due to the metal thin film is related to a surface roughness of the circuit pattern. That is, when the surface roughness of the circuit pattern increases, transmission loss may increase due to a skin effect.

Therefore, when the surface roughness of the circuit pattern is reduced, although it has an effect of preventing a reduction in transmission loss, there is a problem in that the adhesive force between the circuit pattern and the insulating layer is reduced.

In addition, the insulating layer of the circuit board may be formed of a material having a low dielectric constant, and thus transmission loss due to the dielectric material may be reduced.

However, the insulating layer in a circuit board for high frequency applications requires chemical and mechanical properties for use in a circuit board in addition to a low dielectric constant.

In detail, the insulating layer used in a circuit board for high frequency applications must have isotropy of electrical properties for ease of circuit pattern design and process, low reactivity with metal wiring materials, low ionic conductivity and sufficient mechanical strength to withstand processes such as chemical mechanical polishing (CMP), low moisture absorptivity to prevent delamination or increase in dielectric constant, heat resistance to withstand processing temperatures, low coefficient of thermal expansion to eliminate cracking with temperature changes.

In addition, the insulating layer used in the circuit board for high-frequency applications must satisfy various conditions such as adhesion that can minimize various stresses and peeling that can occur at interfaces with other materials (eg, metal thin films), crack resistance, low stress, and low high-temperature gas generation.

Accordingly, the insulating layer used in the circuit board for high-frequency applications should preferentially have low dielectric constant and low coefficient of thermal expansion properties, and accordingly, the overall thickness of the circuit board can be reduced.

However, when manufacturing a circuit board using an insulating layer of a low-k material thinner than a limit, reliability problems such as warpage, cracks and peeling are occurring, and accordingly, reliability problems such as warping, cracking, and peeling increase as the number of layers of the insulating layer of the low-k material increases.

Therefore, there is a demand for a method capable of slimming a circuit board by using an insulating layer of a low dielectric constant material, and solving reliability problems such as warpage, cracking, and peeling.

DISCLOSURE

Technical Problem

An embodiment provides a slimmed circuit board.

In addition, the embodiment provides a circuit board including an insulating layer having a low dielectric constant and a circuit pattern having a low signal loss, and a method of manufacturing the same.

In addition, the embodiment provides a circuit board including a resin coated copper (RCC) having a low coefficient of thermal expansion, and a method of manufacturing the same.

In addition, the embodiment provides a hybrid type circuit board having a mixed laminated structure of a RCC and a prepreg, and a method of manufacturing the same.

In addition, the embodiment provides a circuit board capable of reducing a total number of layers by utilizing a solder resist disposed on an outermost side of the circuit board as a part of an insulating layer, and a method of manufacturing the same.

In addition, the embodiment provides a circuit board capable of dramatically reducing a mold thickness due to chip mounting by forming a cavity in a solder resist used as an outer insulating layer and mounting a device in the formed cavity, and a method of manufacturing the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment includes: an insulating portion including a plurality of insulating layers; a circuit pattern disposed on surfaces of the plurality of insulating layers; and a via respectively formed in the plurality of insulating layers; wherein the insulating portion includes: a first insulating portion including at least one insulating layer; a second insulating portion disposed on the first insulating portion and including a plurality of insulating layers; and a third insulating portion disposed under the first insulating portion and including a plurality of insulating layers; wherein the first insulating portion is formed of prepreg containing glass fibers, wherein at least one of the second insulating portion and the third insulating portion includes a resin coated copper (RCC) and a solder resist disposed on the RCC, wherein the circuit pattern and the via are disposed on a surface of the solder resist and in the solder resist.

In addition, the second insulating portion includes: a first RCC disposed on an upper surface of the first insulating portion; and a first solder resist disposed on an upper surface of the first RCC, wherein the third insulating portion includes: a second RCC disposed under a lower surface of the first insulating portion; and a third RCC disposed under a lower surface of the second RCC.

In addition, the circuit board further includes a second solder resist disposed under a lower surface of the second RCC, and the circuit pattern and the via are not disposed under and in the second solder resist.

In addition, the circuit pattern includes a first pad disposed on an upper surface of the first RCC, and the first solder resist includes a first open region exposing an upper surface of the first pad.

In addition, an upper surface of the first solder resist in the first open region is higher than an upper surface of the first RCC and lower than an upper surface of the first pad.

In addition, the second insulating portion includes: a first RCC disposed on an upper surface of the first insulating portion; and a first solder resist disposed on an upper surface of the first RCC, and wherein the third insulating portion includes: a second RCC disposed under a lower surface of the first insulating portion; and a second solder resist disposed under a lower surface of the second RCC.

In addition, a circuit pattern is respectively formed on a surface of the first solder resist and under a surface of the second solder resist; and a via is respectively formed in the first solder resist and the second solder resist.

In addition, the circuit pattern includes a first pad disposed on an upper surface of the first RCC; and a second pad disposed under a lower surface of the second RCC, wherein the first solder resist includes a first open region exposing an upper surface of the first pad, and the second solder resist includes a second open region exposing a lower surface of the second pad.

In addition, the second insulating portion includes: a first RCC disposed on an upper surface of the first insulating portion; a first-first solder resist disposed on an upper surface of the first RCC; and a first-second solder resist disposed on an upper surface of the first-first solder resist, and wherein the third insulating portion includes second to fourth RCCs sequentially disposed under a lower surface of the first insulating portion, wherein the circuit pattern is formed on a surface of each of the first-first solder resist and the first-second solder resist, and wherein the via is formed in each of the first-first solder resist and the first-second solder resist.

In addition, the circuit pattern includes a first pad disposed on an upper surface of the first RCC, and wherein a first open region is formed by commonly opening the first-first solder resist and the first-second solder resist and exposes an upper surface of the first pad.

In addition, the solder resist on which the circuit pattern and the via are disposed has a two-layer structure, and the via is formed while commonly passing through the solder resist of the two-layer structure.

On the other hand, a method of manufacturing of the circuit board according to the embodiment includes: manufacturing a circuit board having a laminated structure of a plurality of insulating layers by performing a process of forming a circuit pattern on an insulating layer and forming a via passing through the insulating layer a plurality of times, wherein the laminated structure of the plurality of insulating layers includes: a first insulating portion including at least one insulating layer; a second insulating portion disposed on the first insulating portion and including a plurality of insulating layers; and a third insulating portion disposed under the first insulating portion and including a plurality of insulating layers; wherein the first insulating portion is formed of prepreg containing glass fibers, wherein at least one of the second insulating portion and the third insulating portion includes a resin coated copper (RCC) and a solder resist disposed on the RCC, wherein the circuit pattern and the via are disposed on a surface of the solder resist and in the solder resist.

In addition, the second insulating portion includes: a first RCC disposed on an upper surface of the first insulating portion; and a first solder resist disposed on an upper surface of the first RCC, wherein the third insulating portion includes: a second RCC disposed under a lower surface of the first insulating portion; and a third RCC disposed under a lower surface of the second RCC; wherein a second solder resist is disposed under a lower surface of the second RCC, and the circuit pattern and the via are not disposed under and in the second solder resist.

In addition, the circuit pattern includes a first pad disposed on an upper surface of the first RCC, and the method further includes forming a first open region exposing an upper surface of the first pad in the first solder resist; and wherein an upper surface of the first solder resist in the first open region is higher than an upper surface of the first RCC and lower than an upper surface of the first pad.

In addition, the second insulating portion includes: a first RCC disposed on an upper surface of the first insulating portion; and a first solder resist disposed on an upper surface of the first RCC, and wherein the third insulating portion includes: a second RCC disposed under a lower surface of the first insulating portion; and a second solder resist disposed under a lower surface of the second RCC, wherein a circuit pattern is respectively formed on a surface of the first solder resist and under a surface of the second solder resist; and a via is respectively formed in the first solder resist and the second solder resist.

In addition, the circuit pattern includes a first pad disposed on an upper surface of the first RCC; and a second pad disposed under a lower surface of the second RCC, wherein the method further includes forming a first open region exposing an upper surface of the first pad in the first solder resist and forming a second open region exposing a lower surface of the second pad in the second solder resist.

In addition, the second insulating portion includes: a first RCC disposed on an upper surface of the first insulating portion; a first-first solder resist disposed on an upper surface of the first RCC; and a first-second solder resist disposed on an upper surface of the first-first solder resist, and wherein the third insulating portion includes second to fourth RCCs sequentially disposed under a lower surface of the first insulating portion, wherein the circuit pattern is formed on a surface of each of the first-first solder resist and the first-second solder resist, and wherein the via is formed in each of the first-first solder resist and the first-second solder resist.

In addition, the solder resist on which the circuit pattern and the via are disposed has a two-layer structure, and the via is formed while commonly passing through the solder resist of the two-layer structure.

Advantageous Effects

An embodiment allows a part of an insulating layer constituting a circuit board to be made of a solder resist. Here, the solder resist may also be a type of insulating layer. However, the insulating layer meant in the embodiment may refer to a layer in which circuit patterns are disposed and vias electrically connecting circuit patterns disposed on different layers to each other are disposed therein. In other words, the insulating layer in the embodiment means a layer in which circuit patterns are disposed and vias are disposed therein. In addition, the solder resist may refer to a protective layer that protects a surface of the insulating layer. Here, the embodiment allows the insulating layer to be formed using a solder resist that functions to protect the surface of the insulating layer. Accordingly, the embodiment may remove the solder resist disposed on an outermost side, and reduce a thickness of the circuit board by a thickness corresponding to this.

In addition, the embodiment forms an open region in the solder resist to form a cavity in which an electronic component is mounted. Accordingly, the embodiment may allow electronic components to be mounted in an open region opened through the solder resist, accordingly an overall thickness of the circuit board may be reduced by a depth of the open region, and thus slimming may be achieved.

The circuit board according to the embodiment may include a buffer layer disposed between the insulating layer and the circuit pattern. That is, the buffer layer of the circuit board according to the embodiment may be formed on the surface of the circuit pattern or on the insulating layer. The buffer layer may be disposed between the insulating layer and the circuit pattern to improve adhesion between the insulating layer and the circuit pattern.

That is, the insulating layer and the circuit pattern are heterogeneous materials including a resin material and a metal, respectively, and when the circuit pattern is formed on the insulating layer, there is a problem that adhesion is reduced.

Accordingly, adhesion between the insulating layer and the circuit pattern may be improved by disposing the buffer layer chemically bonded to the insulating layer and the circuit pattern between the insulating layer and the circuit pattern.

That is, the buffer layer includes a plurality of functional groups coupled to the insulating layer and the circuit pattern, the functional groups are chemically bonded to the insulating layer and the circuit pattern by a covalent bond or a coordination bond, and thereby adhesion between the insulating layer and the circuit pattern may be improved.

Accordingly, even when the surface roughness of the insulating layer is reduced, it is possible to secure adhesion reliability between the insulating layer and the circuit pattern.

Therefore, when the circuit board according to the embodiment is used for high frequency applications, ae transmission loss of the high-frequency signal can be reduced as the surface roughness of the circuit pattern is lowered, and even if the surface roughness of the circuit pattern is lowered, adhesion between the insulating layer and the circuit pattern can be secured by the buffer layer, and thus overall reliability of the circuit pattern can be secured.

In addition, the circuit board according to the embodiment may include an insulating layer having improved strength with a low dielectric constant and a low coefficient of thermal expansion.

In detail, the insulating layer includes a first material and a second material having a low dielectric constant and improved strength, and the first material may be disposed inside the network structure of the second material in the insulating layer, and thus phase separation between the first material and the second material may be prevented. Accordingly, the insulating layer may be formed of the first material and the second material in a single phase, and thus, strength of the insulating layer may be improved.

That is, it is possible to increase a free volume, that is, molecular motion, of the second material having a network structure by cross-linking, and it can be structured so that polymer chains having a network structure are not closely arranged, and accordingly, the first material and the second material may be formed to have a single phase in the insulating layer as the first material is partially disposed inside the network structure.

Accordingly, when the circuit board according to the embodiment is used for high-frequency applications, it is possible to reduce the transmission loss of the high-frequency signal by reducing the dielectric constant of the insulating layer, and the overall reliability of the circuit board can be secured by improving the coefficient of thermal expansion and mechanical strength of the insulating layer.

In addition, the circuit board according to the embodiment may replace a part of a conventional insulating layer including glass fibers by including an insulating layer having a low dielectric constant and a low coefficient of thermal expansion. Specifically, the circuit board according to the embodiment may remove the glass fiber included in some of a plurality of insulating layers. Specifically, the circuit board according to the embodiment can easily adjust the dielectric constant and the coefficient of thermal expansion of the insulating layer using resin and filler constituting RCC (Resin Coated Copper), accordingly, an overall thickness of the circuit board can be reduced by providing the insulating layer with RCC that does not contain conventional glass fibers. Furthermore, the circuit board according to the embodiment is made of an insulating layer having a low coefficient of thermal expansion, therefore, it is possible to remove the core layer for securing strength and reduce the thickness of the insulating layer, and accordingly, it is possible to provide an insulating layer having a thickness smaller than a thickness of the circuit pattern.

DESCRIPTION OF DRAWINGS

FIG. 1 is a cross-sectional view of a circuit board according to a first embodiment.

FIG. 2 is a view for explaining a first open region formed in a sixth insulating layer according to an embodiment.

FIGS. 3 to 6 are views for explaining an arrangement relationship of a buffer layer of a circuit board according to an embodiment.

FIG. 7 is a view showing a simplified structural formula of a buffer layer of a circuit board according to an embodiment.

FIG. 8 is a view showing a structure of a second material included in an insulating layer of a circuit board according to an embodiment.

FIG. 9 is a view showing an arrangement structure of a first material and a second material included in an insulating layer of a circuit board according to an embodiment.

FIGS. 10 to 15 are views showing a method of manufacturing of a circuit board according to the embodiment shown in FIG. 1 in order of process.

FIG. 16 is a view showing a circuit board according to a second embodiment.

FIG. 17 is a view showing a circuit board according to a third embodiment.

BEST MODE

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and substituted for use.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

Further, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements.

Further, when expressed as "on (over)" or "under (below)", it may include not only the upper direction but also the lower direction based on one element.

Hereinafter, circuit boards according to embodiments will be described with reference to drawings.

FIG. 1 is a view showing a cross-sectional view of a circuit board according to a first embodiment.

Referring to FIG. 1, a circuit board 1000 according to the first embodiment may include an insulating substrate including first to third insulating portions 110, 120, and 130, a first pad 160, a second solder resist SR2, a solder paste 200, and an electronic component 300.

The insulating substrate including first to third insulating portions 110, 120, and 130 may have a flat plate structure. The insulating substrate may be a printed circuit board (PCB). Here, the insulating substrate may be implemented as a single substrate, or alternatively, may be implemented as a multilayer substrate in which a plurality of insulating layers are sequentially laminated.

Accordingly, the insulating substrate may include a plurality of insulating portions 110, 120, 130. As shown in FIG. 1, the plurality of insulating portions includes the first insulating portion 110, a second insulating portion 120 disposed on the first insulating portion 110, and a third insulating portion 130 disposed below the first insulating portion 110.

In this case, the first insulating portion 110, the second insulating portion 120, and the third insulating portion 130 may be formed of different insulating materials. Preferably, the first insulating portion 110 may include glass fiber. In addition, the second insulating portion 120 and the third insulating portion 130 may not include the glass fiber unlike the first insulating portion 110.

Accordingly, a thickness of each insulating layer constituting the first insulating portion 110 may be different from a thickness of each insulating layer constituting the second insulating portion 120 and the third insulating portion 130. In other words, a thickness of each insulating layer constituting the first insulating portion 110 may be greater than a thickness of each insulating layer constituting the second insulating portion 120 and the third insulating portion 130.

That is, the first insulating portion 110 includes glass fiber. The glass fiber generally has a thickness of about 12 μm. Accordingly, a thickness of each insulating layer of the first insulating portion 110 may include the thickness of the glass fiber and may have a range of 19 μm to 23 μm.

Alternatively, the glass fiber is not included in the second insulating portion 120. Preferably, the second insulating portion 120 may be provided of a plurality of layers. The second insulating portion 120 may include insulating layers containing different insulating materials. The second insulating portion 120 may include a resin coated copper (RCC). In addition, the second insulating portion 120 may include a first solder resist SR1. That is, the embodiment allows the solder resist to be provided as the insulating layer disposed on an uppermost side in the laminated structure of the insulating layer of the circuit board. Accordingly, the embodiment may allow one of the solder resists disposed on both sides of the circuit board to be removed, and accordingly, it is possible to provide a slim circuit board.

A thickness of each insulating layer constituting the second insulating portion 120 may range from 10 μm to 15 μm. Preferably, each thickness of the RCC constituting the second insulating portion 120 and the solder resist may be formed within a range not exceeding 15 μm.

In addition, the glass fiber is not included in the third insulating portion 130. Preferably, each insulating layer constituting the third insulating portion 130 may be formed of RCC. For example, the third insulating portion 130 may include a plurality of insulating layers. In addition, each of the plurality of insulating layers constituting the third insulating portion 130 may be provided of RCC. Accordingly, a thickness of each insulating layer of the third insulating portion 130 may have a range of 10 μm to 15 μm That is, the insulating portion constituting the circuit board in a comparative example includes a plurality of insulating layers, and all of the plurality of insulating layers were formed of the prepreg (PPG) including glass fibers. In this case, it is difficult to reduce a thickness of the glass fiber based on the PPG of the circuit board in a comparative example. This is because, when a thickness of the PPG is reduced, the glass fibers included in the PPG may be electrically connected to a circuit pattern disposed on a surface of the PPG, and thus a crack risk is induced. Accordingly, dielectric breakdown and damage to the circuit pattern may occur in the case of reducing the thickness of the PPG of the circuit board in the comparative example. Accordingly, the circuit board in the comparative example had a limit in reducing an overall thickness due to the thickness of the glass fibers of the PPG.

In addition, the printed circuit board of the comparative example is provided of an insulating layer made of only PPG containing glass fibers, and thus has a high dielectric constant. However, a dielectric having a high dielectric constant is difficult to approach as a substitute for high frequencies. That is, the circuit board of the comparative example has a high dielectric constant of glass fiber, and accordingly, a problem in which the dielectric constant is broken in a high frequency band occurs.

Accordingly, the embodiment can provide a highly reliable circuit board capable of minimizing signal loss even in a high frequency band while reducing the thickness of the circuit board according to the insulating layer by using the low-k RCC. Furthermore, the embodiment provides an insulating layer using a solder resist disposed on an outermost side of the circuit board.

Here, the solder resist may also be a type of insulating layer. However, the insulating layer meant in the embodiment may refer to a layer in which circuit patterns are disposed and vias electrically connecting circuit patterns disposed on different layers to each other are disposed therein. In other words, the insulating layer in the embodiment means a layer in which circuit patterns are disposed and vias are disposed therein. In addition, the solder resist may refer to a protective layer that protects a surface of the insulating layer. Here, the embodiment allows the insulating layer to be formed using a solder resist that functions to protect the surface of the insulating layer. Accordingly, the embodiment may remove the solder resist disposed on an outermost side, and reduce a thickness of the circuit board by a thickness corresponding to this.

The first insulating portion 110 may include a first insulating layer 111, a second insulating layer 112, a third insulating layer 113, and a fourth insulating layer 114 from a lower portion. In addition, each of the first insulating layer 111, the second insulating layer 112, the third insulating layer 113, and the fourth insulating layer 114 may be formed of the PPG including glass fibers.

On the other hand, the insulating substrate of the embodiment may be formed of 8 layers based on the insulating layer. However, the embodiment is not limited thereto, and a total number of layers of the insulating layer may increase or decrease.

In addition, the first insulating portion 110 of the first embodiment may be formed of four layers. For example, the first insulating portion 110 of the first embodiment may be formed of four layers of the prepreg.

In addition, the second insulating portion 120 may include a fifth insulating layer 121 and a sixth insulating layer SR1 from a lower portion. The fifth insulating layer 121 may be formed of the RCC having a low dielectric constant and a low coefficient of thermal expansion. In addition, the sixth insulating layer SR1 constituting the second insulating portion 120 may be made of a solder resist. Accordingly, in the embodiment, the solder resist disposed on an upper surface of the sixth insulating layer SR1 may be removed, and thus a thickness of the circuit board may be reduced.

That is, in the first embodiment, the second insulating portion 120 may be provided of two layers. For example, in the first embodiment, the second insulating portion 120 may be provided of one layer of RCC and one layer of solder resist.

Meanwhile, the sixth insulating layer SR1 constituting the second insulating portion 120 may include a plurality of layers. Specifically, the sixth insulating layer SR1 includes a first-first sub solder resist SR1-1 disposed on an upper surface of the fifth insulating layer 121 and a first-second sub solder resist SR1-2 on an upper surface of the first-first sub solder resist SR1-1. That is, the sixth insulating layer SR1 is formed of solder resist, and accordingly, the sixth insulating layer SR1 must have a certain thickness to form vias and circuit patterns. However, there is a limit to forming the solder resist to a certain thickness or more as a single layer, and flatness problems may occur even if the solder resist is provided as a single layer.

Therefore, when the sixth insulating layer SR1 is formed of a solder resist, the embodiment provides the sixth insulating layer SR1 in two layers to solve the above problem. Meanwhile, the sixth insulating layer SR1 may include a first open region OR1 exposing a first pad 160 of a circuit pattern disposed on an upper surface of the fifth insulating layer 121. The first open region OR1 may be formed in a recess shape. That is, a general open region is formed in a hole shape. For example, when an open region is formed in the sixth insulating layer SR1, the open region of a comparative example has a hole shape exposing an upper surface of the fifth insulating layer 121. Alternatively, the first open region OR1 in the embodiment may be formed covering an entire upper surface of the fifth insulating layer 121 while selectively exposing the upper surface of the first pad 160. For example, a height of an upper surface of the sixth insulating layer SR1 in the first open region OR1 in the embodiment may be positioned higher than a height of the upper surface of the fifth insulating layer 121 and may be positioned lower than a height of the upper surface of the first pad 160. This will be explained below.

In addition, the third insulating portion 130 may include a seventh insulating layer 131 and an eighth insulating layer 132 from an upper portion. The seventh insulating layer 131 and the eighth insulating layer 132 constituting the third insulating portion 130 may be formed of the RCC having a low dielectric constant and a low coefficient of thermal expansion. That is, the third insulating portion 130 of the first embodiment may be formed of two layers. For example, the third insulating portion 130 of the first embodiment may be formed of two layers of the RCC.

Meanwhile, it is shown that a total number of layers of the insulating layer of the first embodiment is eight, the first insulating portion 110 is formed of four layers of prepreg, the second insulating portion 120 is formed of a mixed structure of two layers of RCC and solder resist, and the third insulating portion 130 is formed of two layers of RCC. But, the embodiment is not limited thereto, and a number of layers of the insulating layer constituting the first insulating portion 110 may increase or decrease.

However, a coefficient of thermal expansion (CTE) of a RCC insulating layer constituting the second insulating portion 120 and the third insulating portion 130 of the embodiment may be determined according to a number of the RCC layer of the second insulating portion 120 and the third insulating portion 130.

Preferably, the RCC of the embodiment includes the fifth insulating layer 121, the seventh insulating layer 131 and the eighth insulating layer 132. In addition, the coefficient of thermal expansion (CTE) of the fifth insulating layer 121, the seventh insulating layer 131, and the eighth insulating layer 132 composed of the RCC may be determined based on a coefficient of thermal expansion (CTE) of the prepreg constituting the first insulating portion 110. Specifically, the coefficient of thermal expansion (CTE) of the fifth insulating layer 121, the seventh insulating layer 131, and the eighth insulating layer 132 composed of the RCC may basically have a coefficient of thermal expansion (CTE) in a first range corresponding to a coefficient of thermal expansion (CTE) of the prepreg constituting the first insulating portion 110. Furthermore, the fifth insulating layer 121, the seventh insulating layer 131, and the eighth insulating layer 132 composed of the RCC may have a coefficient of thermal expansion (CTE) in a second range smaller than the first range according to a total number of layers of the insulating layer composed of the RCC. In this case, the coefficient of thermal expansion (CTE) in the second range may be included in the first range. On the other hand, the coefficient of thermal expansion (CTE) of the fifth insulating layer 121, the seventh insulating layer 131, and the eighth insulating layer 132 composed of the RCC can be easily adjusted by adjusting a content of a filler included in the RCC.

As described above, the circuit board according to the first embodiment includes the first insulating portion 110, the second insulating portion 120, and the third insulating portion 130, and the first insulating portion 110 may be formed of the prepreg including glass fiber, and a part of the second insulating portion 120 and the third insulating portion 130 may be formed of the RCC having a low dielectric constant for use in a circuit board applied to a high frequency application. Accordingly, the embodiment can improve the reliability of a circuit board by ensuring mechanical/chemical safety while having a low dielectric constant by using the properties of the RCC. In addition, the embodiment allows a part of the insulating layer constituting the second insulating portion 120 to be formed of a solder resist. Accordingly, the embodiment can remove a protective layer disposed on an outermost side, and thus achieve slimming of the circuit board.

Meanwhile, a circuit pattern 140 may be disposed on a surface of the insulating layer constituting each of the first insulating portion 110, the second insulating portion 120, and the third insulating portion 130.

Preferably, a circuit pattern 140 may be disposed on at least one surface of each of the first insulating layer 111, the second insulating layer 112, the third insulating layer 113, the fourth insulating layer 114, the fifth insulating layer 121, the sixth insulating layer SR1, the seventh insulating layer 131 and the eighth insulating layer 132.

The circuit pattern 140 is a wire that transmits an electrical signal, and may be formed of a metal material having high electrical conductivity. To this end, the circuit pattern 140 may be formed of at least one metal material selected from gold (Au), silver (Ag), platinum (Pt), titanium (Ti), tin (Sn), copper (Cu), and zinc (Zn).

In addition, the circuit pattern 140 may be formed of a paste or solder paste including at least one metal material selected from among gold (Au), silver (Ag), platinum (Pt), titanium (Ti), tin (Sn), copper (Cu), and zinc (Zn) having excellent bonding strength. Preferably, the circuit pattern 140 may be formed of copper (Cu), which has high electrical conductivity and is relatively inexpensive.

In addition, the circuit pattern 140 may have a thickness of 12 μm±2 μm. That is, the thickness of the circuit pattern 140 may be in a range of 10 μm to 14 μm.

The circuit pattern 140 may be formed using additive process, subtractive process, MSAP (Modified Semi Additive Process), and SAP (Semi Additive Process) method, which is a typical circuit board manufacturing process, and a detailed description thereof will be omitted herein.

Meanwhile, the circuit pattern 140 may include a first pad 160. For example, a circuit pattern disposed on an upper surface of the fifth insulating layer 121 may include a first pad 160 whose upper surface is exposed through the first open region OR1 of the sixth insulating layer SR1. The first pad 160 may be formed in a device mounting region where a device according to an embodiment is mounted. For example, the first pad 160 may be a device mounting pad on which a device according to the embodiment is mounted.

Meanwhile, a buffer layer 400 may be disposed on each of the insulating layers of the first insulating portion 110, the second insulating portion 120, and the third insulating portion 130 and/or on the surface of the circuit pattern 140. In detail, the buffer layer 400 may be disposed on the surface of at least one of upper, lower, and side surfaces of the circuit pattern 140 or on the surface of the insulating layer on which the circuit pattern is disposed.

The buffer layer formed on the insulating layer or the circuit pattern will be described in detail below.

At least one via 150 is formed in at least one of the plurality of insulating layers constituting the first insulating portion 110, the second insulating portion 120, and the third insulating portion 130. The via 150 is disposed to pass through at least one insulating layer among the plurality of insulating layers. The via 150 may pass through only one insulating layer among the plurality of insulating layers. Alternatively, the via 150 may be formed while passing through at least two insulating layers among the plurality of insulating layers in common. Accordingly, the via 150 electrically connects the circuit patterns disposed on the surfaces of different insulating layers to each other.

Here, the embodiment may include the via 150 formed in the sixth insulating layer SR1. Furthermore, the embodiment may include a circuit pattern disposed on an upper surface of the sixth insulating layer SR1. The via disposed in the sixth insulating layer SR1 may electrically connect between the circuit pattern disposed on the upper surface of the sixth insulating layer SR1 and the circuit pattern disposed on the upper surface of the fifth insulating layer 121.

The via 150 may be formed by filling an inside of a through hole (not shown) passing through at least one insulating layer among the plurality of insulating layers with a conductive material.

When the through hole is formed by mechanical processing, the through hole may be formed by methods such as milling, drilling, and routing, and when the through hole is formed by laser processing, the through hole may be formed by a UV or $CO_2$ laser method, and when the through hole is formed by chemical processing, the through hole may be formed using chemicals including amino-silane, ketones, etc., and thereby the first insulating layer 110 may be opened.

On the other hand, the processing by the laser is a cutting method that takes the desired shape to melt and evaporate a part of the material by concentrating optical energy on the surface, it can easily process complex formations by computer programs, and can process composite materials that are difficult to cut by other methods.

In addition, the processing by the laser can have a cutting diameter of at least 0.005 mm, and has a wide advantage in a range of possible thicknesses.

As the laser processing drill, it is preferable to use a YAG (Yttrium Aluminum Garnet) laser, a $CO_2$ laser, or an ultra-violet (UV) laser. The YAG laser is a laser that can process both the copper foil layer and the insulating layer, and the $CO_2$ laser is a laser that can process only the insulating layer.

When the through hole is formed, the via 150 is formed by filling the inside of the through hole with a conductive material. The metal material forming the via 150 may be any one material selected from copper (Cu), silver (Ag), tin (Sn), gold (Au), nickel (Ni), and palladium (Pd), and the conductive material may be filled using any one or a combination of electroless plating, electrolytic plating, screen printing, sputtering, evaporation, inkjetting and dispensing.

As described above, the first pad 160 may be exposed through the first open region OR1 of the sixth insulating layer SR1. The first pad 160 may be provided in plurality. In addition, some of the first pads 160 may serve as patterns for signal transmission, and other portions may serve as an inner lead electrically connected to the electronic component 300.

In addition, a surface treatment layer (not shown) may be disposed on the first pad 160. The surface treatment layer may improve soldering properties while protecting the first pad 160.

To this end, the surface treatment layer may be formed of a metal including gold (Au). Preferably, the surface treatment layer may include only pure gold (purity of 99% or more), and alternatively, may be formed of an alloy containing gold (Au). When the surface treatment layer are formed of an alloy containing gold, the alloy may be formed of a gold alloy containing cobalt.

Meanwhile, a solder paste 200 is disposed on the first pad 160. The solder paste 200 is an adhesive for fixing the electronic component 300 attached to the insulating substrate. Accordingly, the solder paste 200 may also be referred to as an adhesive. The adhesive may be a conductive adhesive, alternatively may be a non-conductive adhesive. That is, the circuit board may be a board to which the electronic component 300 is attached by a wire bonding method, and accordingly, a terminal (not shown) of the electronic component 300 may not be disposed on the adhesive. Also, the adhesive may not be electrically connected to the electronic component 300. Accordingly, the adhesive may use a non-conductive adhesive, or alternatively, may use a conductive adhesive.

The conductive adhesive is broadly divided into an anisotropic conductive adhesive and an isotropic conductive adhesive, and basically included conductive particles such as Ni, Au/polymer, or Ag, and thermosetting, thermoplastic, or a blend type insulating resin that mixes the properties of both.

In addition, the non-conductive adhesive may be a polymer adhesive, preferably a non-conductive polymer adhesive including a thermosetting resin, a thermoplastic resin, a filler, a curing agent, and a curing accelerator.

Here, the electronic component 300 may include both devices and chips. The device may be divided into an active device and a passive device, and the active device is a device that actively uses a non-linear portion, and the passive device refers to a device that does not use the non-linear characteristic even though both linear and non-linear characteristics exist. In addition, the passive device may include a transistor, an IC semiconductor chip, and the like, and the passive device may include a capacitor, a resistor, an inductor, and the like. The passive device is mounted on a general printed circuit board to increase a signal processing speed of a semiconductor chip, which is an active device, or to perform a filtering function.

Consequently, the electronic component 300 may include all of a semiconductor chip, a light emitting diode chip, and other driving chips.

A resin molding portion (not shown) may be formed on the uppermost insulating layer, and accordingly, the electronic component 300 and the first pad 160 may be protected by the resin molding portion.

Meanwhile, a solder resist is disposed on a surface of an uppermost insulating layer of a general circuit board. In this case, in the embodiment, the uppermost insulating layer is composed of a solder resist, and accordingly, a solder resist additionally disposed on the sixth insulating layer SR1 may be omitted.

Meanwhile, a second solder resist SR2 is disposed below a lowermost insulating layer among the plurality of insulating layers. The second solder resist SR2 may be a protective layer protecting a lower surface of the eighth insulating layer 132.

FIG. 2 is a view for explaining a first open region formed in a sixth insulating layer according to an embodiment.

Referring to FIG. 2, an upper region of the fifth insulating layer 121 in the embodiment may include a first region R1 and a second region R2. The first region R1 may be a component mounting region where the electronic component 300 is disposed. The second region R2 may be a region other than the first region R1.

A first open region OR1 may be formed in the sixth insulating layer SR1 to correspond to the first region R1. The first open region OR1 may expose an upper surface of the first pad 160 disposed in the first region R1.

In this case, the first pad 160 may have a first height H1. In addition, an upper surface of the sixth insulating layer SR1 in the first open region OR1 may have a second height H2 lower than the first height H1. For example, the second height H2 may have a range of 5% to 95% of the first height H1. For example, the second height H2 may have a range of 10% to 90% of the first height H1. For example, the second height H2 may have a range of 20% to 80% of the first height H1.

In this case, when the second height H2 is smaller than 5% of the first height H1, a problem that the surface of the fifth insulating layer 121 is removed may occur due to process deviation in a formation process of the first open region OR1. In addition, when the second height H2 is smaller than 5% of the first height H1, a problem that the first pad 160 is damaged may occur due to process deviation in a formation process of the first open region OR1.

In addition, when the second height H2 is greater than 95% of the first height H1, a problem in that the first pad 160 is covered by the sixth insulating layer SR1 may occur due to process deviation in a formation process of the first open region OR1. In addition, when the second height H2 is greater than 95% of the first height H1, a resin corresponding to the sixth insulating layer SR1 may remain on the surface of the first pad 160 during the formation of the first open region OR1, and thus reliability of circuit connection characteristics may deteriorate.

Meanwhile, as described above, a buffer layer may be disposed on at least one surface of the insulating layer or the circuit pattern 140.

In detail, the buffer layer 400 may be disposed between the insulating layer and the circuit pattern 140 in a region where the insulating layer and the circuit pattern 140 overlap.

The buffer layer 400 may be a surface treatment layer treated on the surface of the insulating layer. The buffer layer 400 may be a surface treatment layer treated on the surface of the circuit pattern 140.

The buffer layer 400 may be an intermediate layer disposed between the insulating layer and the circuit pattern. The buffer layer 400 may be a coating layer disposed between the insulating layer and the circuit pattern. The buffer layer 400 may be a functional layer that improves adhesion between the insulating layer and the circuit pattern, that is, an adhesion strengthening layer.

FIGS. 3 to 6 are views for explaining the position and arrangement relationship of the buffer layer 400. Hereinafter, a position and arrangement relationship of a buffer layer 400 disposed on the fifth insulating layer 121 of the second insulating portion 120 among the plurality of insulating portions will be described. However, the buffer layer 400 may also be disposed on the insulating layer of the first insulating portion 110 and the third insulating portion 130 to correspond to the position and arrangement relationship described below.

Referring to FIG. 3, the buffer layer 400 may be disposed on the surface of the circuit pattern. For example, the buffer layer 400 may be disposed on an upper surface and a lower surface of the circuit pattern. That is, the buffer layer 400 may be disposed on a surface that contacts or faces the insulating layer among the surfaces of the circuit pattern.

Alternatively, referring to FIG. 4, the buffer layer 400 may be disposed on the surface of the circuit pattern. For example, the buffer layer 400 may be disposed on an upper surface, a lower surface, and both sides of the circuit pattern. That is, the buffer layer 400 may be disposed to surround the entire surface of the circuit pattern.

Alternatively, referring to FIG. 5, the buffer layer 400 may be disposed on the surface of the insulating layer. For example, the buffer layer 400 may be disposed on an upper surface and a lower surface of the insulating layer. That is, the buffer layer 400 may be disposed on a surface of the insulating layer that contacts or faces the circuit pattern 140. That is, the buffer layer 400 may be disposed on an entire surface of the insulating layer on which the circuit pattern 140 is disposed.

Alternatively, referring to FIG. 6, the buffer layer 400 may be disposed on the surface of the insulating layer. For example, the buffer layer 400 may be disposed on an upper surface and a lower surface of the insulating layer. That is, the buffer layer 400 may be disposed on a surface of the insulating layer that contacts or faces the circuit pattern 140. That is, the buffer layer 400 may be disposed only in a region where the circuit pattern 140 is disposed on the surface of the insulating layer on which the circuit pattern 140 is disposed.

That is, the buffer layer 400 may be disposed between the insulating layer and the circuit pattern 140. In detail, the buffer layer 400 may be disposed between the insulating layer and the circuit pattern 140, and the buffer layer 400 may be coupled to one surface of the insulating layer and one surface of the circuit pattern 140. That is, a terminal group of the buffer layer and a terminal group of the insulating layer, and a terminal group of the buffer layer and a terminal group of the circuit pattern may be chemically bonded.

The buffer layer 400 may be formed to have a constant thickness. In detail, the buffer layer 400 may be formed as a thin film. In detail, the buffer layer 400 may be formed to a thickness of 500 nm or less. In more detail, the buffer layer 400 may be formed to a thickness of 5 nm to 500 nm.

When the thickness of the buffer layer 400 is formed to be 5 nm or less, the thickness of the buffer layer is too thin to sufficiently secure adhesion between the insulating layer and the circuit pattern, and when the thickness of the buffer layer is formed to exceed 500 nm, the effect of improving adhesion according to the thickness is insignificant, an overall thickness of the circuit board may be increased, and a dielectric constant of the insulating layer may increase, so that a transmission loss of the circuit board may increase in high frequency applications.

The buffer layer 400 may include a plurality of elements. A plurality of elements included in the buffer layer 400 are combined with each other in the buffer layer and included in molecular or ionic form, and the molecules, the molecules, and the ions may be chemically bonded to each other to form a buffer layer.

The buffer layer 400 may include at least one of a carbon element, a nitrogen element, an oxygen element, a silicon element, a sulfur element, and a metal element. In detail, the buffer layer 400 may include all of a carbon element, a nitrogen element, an oxygen element, a silicon element, a sulfur element, and a metal element.

The carbon element, nitrogen element, oxygen element, silicon element, sulfur element, and metal element may be present in a molecular form by bonding to each other in the buffer layer, or may exist in an ionic form alone.

The oxygen element, the carbon element, and the nitrogen element among the plurality of elements may be related to a functional group of the buffer layer coupled to the insulating layer. That is, a functional group formed by molecules including the oxygen element, the carbon element, the nitrogen atom, and the like may be chemically bonded to the insulating layer.

In addition, the carbon element, the nitrogen element, the silicon element, and the sulfur element among the plurality of elements may be related to a functional group of the buffer layer coupled to the circuit pattern. That is, a functional group formed by molecules including the carbon element, the nitrogen element, the silicon element, the sulfur element, etc. may be chemically bonded to the circuit pattern.

In addition, the metal element may combine molecules formed by the carbon element, nitrogen element, oxygen element, silicon element, and sulfur element to each other. That is, molecules formed by the carbon element, nitrogen element, oxygen element, silicon element, and sulfur element may be chemically combined through the metal element to form a buffer layer. That is, the metal element may be disposed between the molecules to serve as a medium for chemically bonding the molecules.

To this end, the carbon element, nitrogen element, oxygen element, silicon element, sulfur element, and metal element may be included in a constant mass ratio. In detail, the metal element among the plurality of elements may be included the most than other elements, and the carbon element, nitrogen element, oxygen element, silicon element, and sulfur element may each be included in a constant mass ratio based on the metal element.

Specifically, a ratio of the carbon element to the metal element ((carbon element/copper element)*100) may be 5 to 7, In addition, a ratio of the nitrogen element to the metal element ((nitrogen element/copper element)*100) may be 1.5 to 7.

In addition, a ratio of the oxygen element to the metal element ((oxygen element/copper element)*100) may be 1.1 to 1.9.

In addition, a ratio of the silicon element to the metal element ((silicon element/copper element)*100) may be 0.5 to 0.9.

In addition, a ratio of the sulfur element to the metal element ((sulfur element/copper element)*100) may be 0.5 to 1.5.

A ratio of the carbon element, nitrogen element, oxygen element, silicon element, and sulfur element to the metal element may be related to a bonding strength of the insulating layer or the circuit board.

In detail, when the ratio of the carbon element to the metal element ((carbon element/copper element)*100) is out of the range of 5 to 7, the bonding force between the buffer layer and the circuit board or the buffer layer and the insulating layer may be weakened.

In addition, when the ratio of the nitrogen element to the metal element ((nitrogen element/copper element)*100) is out of the range of 1.5 to 7, the bonding force between the buffer layer and the circuit board or the buffer layer and the insulating layer may be weakened.

In addition, when the ratio of the oxygen element to the metal element ((oxygen element/copper element)*100) is out of the range of 1.1 to 1.9, the bonding force between the buffer layer and the insulating layer may be weakened.

In addition, when the ratio of the silicon element to the metal element ((silicon element/copper element)*100) is out of the range of 0.5 to 0.9, the bonding force between the buffer layer and the circuit board may be weakened.

In addition, when the ratio of the sulfur element to the metal element ((sulfur element sulfur/copper element)*100) is out of the range of 0.5 to 1.5, the bonding force between the buffer layer and the circuit board may be weakened.

Meanwhile, the carbon element, nitrogen element, oxygen element, silicon element, sulfur element, and metal element exist in the form of molecules or ions in the buffer layer, and the molecules and the ions may be connected to each other by bonding.

In detail, the buffer layer 400 may include molecules and metal ions formed by the carbon element, nitrogen element, oxygen element, silicon element, sulfur element, and metal elements. The molecules included in the buffer layer 400 may include at least two types of molecules depending on the size of the molecule or the size of the molecular weight. In detail, the molecule may include macromolecule and unimolecule.

The macromolecule, the unimolecule, and the metal ion may be formed in a structure in which they are bonded to each other in the buffer layer.

In detail, the macromolecule, the unimolecule, and the metal ion may be chemically bonded through covalent bonds and coordination bonds in the buffer layer to form a structure in which they are connected to each other.

The metal ion may connect the macromolecules, the unimolecules, or the macromolecule and the unimolecules to each other. In detail, the macro molecules, the unimolecules, or the macromolecule and the unimolecule are coordinate bonded with the metal ion, and accordingly, the macromolecules, the unimolecule, or the macromolecule and the unimolecule can be chemically bound.

The metal ions may include the same material as the circuit pattern. Alternatively, the metal ion may include a material different from that of the circuit pattern. For example, when the circuit pattern includes copper, the metal ions may include copper or a metal other than copper.

In detail, the metal ions may be formed by the circuit pattern. In detail, metal ions may be formed by ionizing the circuit pattern including metal using a separate oxidizing agent. Accordingly, the ionized metal ions may form a buffer layer by coordinating the macro molecules and the unimolecules in the buffer layer to connect the molecules to each other.

Alternatively, a metal ion may be separately added when the buffer layer is formed, and the metal ion may form a buffer layer by coordinating the macro molecule and the single molecule in the buffer layer to connect the molecules to each other. In this case, the separately added metal ions may be the same as or different from the metal of the circuit pattern.

The macromolecule and the unimolecule may include at least one of the carbon element, nitrogen element, oxygen element, silicon element, and sulfur element.

That is, the macromolecule and the unimolecule may be molecules including at least one of the carbon element, nitrogen element, oxygen element, silicon element, and sulfur element.

In detail, the macromolecule may include a molecule including the carbon element and the nitrogen element. In detail, the macromolecule may include an azole group including the carbon element and the nitrogen element.

In addition, the macromolecule may include a molecule including the silicon element. In detail, the macro molecule may include a silane group including the silicon element.

In addition, the unimolecule may include the carbon element, the nitrogen element, and the sulfur element. That is, the unimolecule may be a molecule including the carbon element, the nitrogen element, and the sulfur element. For example, the unimolecule may include an SCN group to which a thiocyanate group (—SCN) is connected.

Referring to FIG. 7, the buffer layer 400 may include a plurality of functional groups. In detail, the buffer layer 400 may include a first functional group chemically bonded to the insulating layer and a second functional group chemically bonded to the circuit pattern 140.

That is, the macromolecule and the unimolecules may include a plurality of terminal groups, ie, functional groups, chemically bonded to the insulating layer and the circuit pattern. By these functional groups, the insulating layer and the circuit pattern are chemically tightly coupled by the buffer layer, so that adhesion between the insulating layer and the circuit pattern can be improved.

The first functional group and the second functional group may be defined as terminal groups of the buffer layer connected to one of the macromolecule, the mono atom, or the metal atom.

The first functional group may be bonded to the insulating layer by a covalent bond. The first functional group may include functional groups covalently bonded to the insulating layer. In detail, the first functional group may include a hydroxyl group (—OH) and an N group of the azole group.

In addition, the second functional group may be coupled to the circuit pattern 140 by coordination bonding. The second functional group may include functional groups coordinated with the circuit pattern 140. In detail, the second functional group may include a Si group and a thiocyanate group (—SCN) of a silane group.

The first functional group and the second functional group included in the buffer layer may be chemically bonded to the insulating layer and the circuit pattern, respectively. Accordingly, by the buffer layer disposed between the insulating layer and the circuit pattern, adhesion between the insulating layer, which is a dissimilar material, and the circuit pattern may be improved.

Meanwhile, as described above, the fifth insulating layer 121, the seventh insulating layer 131, and the eighth insulating layer 132 composed of RCC may include a material capable of securing mechanical/chemical reliability with a low dielectric constant.

In detail, the fifth insulating layer 121, the seventh insulating layer 131, and the eighth insulating layer 132 may have a dielectric constant Dk of 3.0 or less. In more detail, the fifth insulating layer 121, the seventh insulating layer 131, and the eighth insulating layer 132 may have a dielectric constant of 2.03 to 2.7. Accordingly, the insulating layer may have a low dielectric constant, and transmission loss according to the dielectric constant of the insulating layer may be reduced when the insulating layer is applied to a circuit board for high frequency applications.

The RCC may be formed of three layers in a laminated structure of all the insulating layer in the first embodiment. The RCC may be composed of three layers in the laminated structure of all insulating layers in the first embodiment. For example, the circuit board in the first embodiment may be composed of four insulating layers formed of prepreg, three insulating layers formed of RCC, and one insulating layer formed of solder resist.

For example, the RCC of the circuit board of the first embodiment may occupy a number of layers in a range of 20% to 50% of a total number of layers of the insulating layer.

For example, the RCC of the circuit board of the first embodiment may occupy a thickness in a range of 20% to 50% of a total thickness of the insulating layer. Here, the total thickness of the insulating layer may mean a thickness of only the insulating layers excluding a thickness of the circuit pattern, a thickness of the buffer layer, and a thickness of the protective layer from a total thickness of the circuit board.

In this case, the fifth insulating layer 121, the seventh insulating layer 131, and the eighth insulating layer 132 may have a coefficient of thermal expansion of 50 ($10^{-6}$ m/m·k) or less. Here, the fifth insulating layer 121, the seventh insulating layer 131, and the eighth insulating layer 132 may have a coefficient of linear expansion of 50 ($10^{-6}$ m/m·k) or less, as can be seen from an unit of the coefficient of thermal expansion. In detail, the fifth insulating layer 121, the seventh insulating layer 131, and the eighth insulating layer 132 may have a coefficient of thermal expansion in a range of 10 to 50 ($10^{-6}$ m/m·k).

That is, the fifth insulating layer 121, the seventh insulating layer 131, and the eighth insulating layer 132 of the first embodiment may occupy 20% to 50% of a number of layers or a thickness in the laminated structure of all of the insulating layer, and as an example of this, the fifth insulating layer 121, the seventh insulating layer 131, and the eighth insulating layer 132 may be formed of three layers, and each of the RCC may have a coefficient of thermal expansion in a range of 10 to 50 ($10^{-6}$ m/m·k).

In this case, the coefficient of thermal expansion of the fifth insulating layer 121, the seventh insulating layer 131, and the eighth insulating layer 132 can be easily adjusted by adjusting a content of a filler included in the fifth insulating layer 121, the seventh insulating layer 131, and the eighth insulating layer 132.

That is, the RCC constituting the fifth insulating layer 121, the seventh insulating layer 131, and the eighth insulating layer 132 may contain a filler of 55 wt % to 73 wt % to have a coefficient of thermal expansion in a range of 10 to 50 ($10^{-6}$ m/m·k).

In this case, when the coefficient of thermal expansion of the RCC constituting the fifth insulating layer 121, the seventh insulating layer 131, and the eighth insulating layer 132 is out of the range of 10 to 50 ($10^{-6}$ m/m·k), a problem may occur in the overall reliability of the circuit board. For example, when the coefficient of thermal expansion of the RCC constituting the fifth insulating layer 121, the seventh insulating layer 131, and the eighth insulating layer 132 is greater than 50 ($10^{-6}$ m/m·k), warpage may occur in a lamination process of the circuit board due to mismatching with a coefficient of thermal expansion of the prepreg constituting the first insulating portion 110.

That is, the circuit board is manufactured by sequentially laminating heterogeneous insulating layers including the prepreg and the RCC. In this case, continuous stress due to heat may be provided to the circuit board in the process of sequentially laminating the prepreg and the RCC. And, a degree of warpage of the circuit board increases due to the stress as described above.

Accordingly, a stretching rate of the RCC of the embodiment corresponds to a stretching rate of the prepreg in order to minimize the stress generated during the lamination process of a hybrid type circuit board including the prepreg and the RCC, so that it is possible to minimize the degree of warpage of the circuit board.

In the above embodiment, the fifth insulating layer 121, the seventh insulating layer 131, and the eighth insulating layer 132 may have a low coefficient of thermal expansion, thereby minimizing cracks in the insulating layer due to temperature change.

To this end, the fifth insulating layer 121, the seventh insulating layer 131, and the eighth insulating layer 132 may be formed of two materials. In detail, the fifth insulating layer 121, the seventh insulating layer 131, and the eighth insulating layer 132 may include a material in which two compounds are mixed. In detail, the fifth insulating layer 121, the seventh insulating layer 131, and the eighth insulating layer 132 may include a first compound and a second compound.

The first material and the second material may be included in a certain ratio range. In detail, the first material and the second material may be included in a ratio of 4:6 to 6:4.

In addition, the fifth insulating layer 121, the seventh insulating layer 131, and the eighth insulating layer 132 may further include a filler. In detail, the fifth insulating layer 121, the seventh insulating layer 131, and the eighth insulating layer 132 may further include the filler such as silicon dioxide ($SiO_2$). The filler of the first embodiment may be included in an amount of about 55 wt % to about 73 wt % based on all of the fifth insulating layer 121, the seventh insulating layer 131, and the eighth insulating layer 132.

When the ratio of the filler is out of the above range, a coefficient of thermal expansion or a dielectric constant may be increased by the filler, and thus properties of the insulating layer may be deteriorated and a warpage phenomenon may occur due to mismatching of a coefficient of thermal expansion with the prepreg.

In addition, the first material and the second material may be chemically non-bonded with each other in the fifth insulating layer 121, the seventh insulating layer 131, and the eighth insulating layer 132. However, embodiments are not limited thereto, and the first material including the first compound and the second material including the second compound may be directly chemically bonded or chemically bonded by a separate linking group.

The first material may include a material having an insulating property. In addition, the first material may have improved mechanical properties due to high impact strength. In detail, the first material may include a resin material. For example, the first material may include a first compound including polyphenyl ether (PPE).

The first material may include a plurality of the first compounds, and the first compounds may be formed by chemically bonding with each other. In detail, the first compound may be linearly connected to each other by a covalent bond, that is, a pi-pi bond (π-π).

That is, the first compounds may be formed by chemically bonding with each other so that the first material has a molecular weight of about 300 to 500.

In addition, the second material may include a second compound. In detail, the second material may be formed by chemically bonding a plurality of second compounds to each other.

The second compound may include a material having a low dielectric constant and a coefficient of thermal expansion. In addition, the second compound may include a material having improved mechanical strength.

The second compound may include tricyclodecane and a terminal group connected to the tricyclodecane. The terminal group connected to the tricyclodecane may include various materials in which the second compounds may be connected to each other by a carbon double bond (C=C bonding). In detail, the terminal group connected to the tricyclodecane may include an acrylate group, an epoxide group, a carboxyl group, a hydroxyl group, and an isocyanate group.

The second compounds may be linked to each other between the terminal groups connected to the tricyclodecane. Specifically, the second compounds are cross-linked between the terminal groups by a carbon double bond (C=C bonding) to form a network structure.

Specifically, referring to FIG. 8, the second compounds may be cross-linked to form a network structure. That is, the second compounds may be an aggregate of bonds having a plurality of network structures.

Accordingly, the second material formed by the second compounds may have a low dielectric constant and a low coefficient of thermal expansion according to material properties, and may have improved mechanical strength due to the network structure.

FIG. 9 is a view for explaining an arrangement of the first material and the second material forming the insulating layer.

The first material and the second material may be formed as one single phase in each of the fifth insulating layer 121, the seventh insulating layer 131, and the eighth insulating layer 132. Referring to FIG. 8, the first material connected by the covalent bond of the first compound may be disposed inside the second material formed by the second compound cross-linked to each other to form a network structure.

In detail, the first compound may be disposed inside the network structure of the second material formed by chemically bonding the second compound to prevent the first material from being separated from the second material.

That is, the first material and the second material included in the fifth insulating layer 121, the seventh insulating layer 131, and the eighth insulating layer 132 are not disposed to be phase-separated in the insulating layer, and may be formed in a one single-phase structure. Accordingly, it may be formed in one single phase while having a low dielectric constant and a low coefficient of thermal expansion due to the material properties of the first material and the second material, and thus have high mechanical strength.

On the other hand, the first insulating portion 110 of the first embodiment includes an insulating layer of the PPG including glass fiber, and the second insulating portion 120 includes the RCC and the solder resist, and the third insulating portion 130 include the RCC. And, the RCC of the second insulating portion 120 and the third insulating portion 130 is a RCC having a low dielectric constant and a low coefficient of thermal expansion as described above.

As described above, the coefficient of thermal expansion of the fifth insulating layer 121, the seventh insulating layer 131, and the eighth insulating layer 132 is in a range of 10 to 50 ($10^{-6}$ m/m·k). To this end, the fifth insulating layer 121, the seventh insulating layer 131, and the eighth insulating layer 132 of the first embodiment may be formed of the RCC, and the RCC may include a filler of 55 wt % to 73 wt %.

As described above, the coefficient of thermal expansion of the RCC of the first embodiment is included in a first range as the RCC constituting the second insulating portion 120 and the third insulating portion 130 is formed of a total of three layers.

In this case, the coefficient of thermal expansion of the RCC may have a second range smaller than the first range according to the number of layers, and may have a third range larger than the first range. That is, the coefficient of thermal expansion of the RCC may have a second range smaller than the first range when the number of layers increases (five or more layers). In addition, the coefficient of thermal expansion of the RCC may have a third range greater than the first range when the number of layers is decreased (three layers or less).

Hereinafter, the present invention will be described in more detail through the measurement of the dielectric constant of the RCC constituting a part of the second insulating portion and all of the third insulating portion according to the Examples and Comparative Examples of the present application. These embodiments are merely presented as examples in order to explain the present invention in more detail. Therefore, the present invention is not limited to these examples.

Embodiment 1

A copper layer was formed on the insulating layer. In this case, the copper layer and the insulating layer were adhered after coating a coating layer containing a carbon element, a nitrogen element, an oxygen element, a silicon element, a sulfur element, and a metal element on the surface of the circuit layer in contact with the insulating layer.

Then, the copper layer was patterned to form a circuit pattern, thereby manufacturing a circuit board.

In this case, the buffer layer included a first functional group including a hydroxyl group (—OH) and an N group of the azole group, and a second functional group including a Si group and a thiocyanate group (—SCN) of a silane group.

Next, adhesion and reliability were evaluated according to a roughness size of the circuit pattern.

Comparative Example 1

A circuit pattern was formed in the same manner as in the embodiment, except that a copper layer was formed by directly bonding a copper layer on the insulating layer without forming a coating layer on the copper layer, and a circuit pattern was formed by patterning the copper layer. And, evaluation of adhesion and reliability according to the roughness size of the circuit pattern was performed after the forming of the circuit pattern.

Adhesion/Reliability Measurement Method

The evaluation of the adhesion of the circuit patterns according to embodiments and Comparative Examples was performed using an UTM 90° Peel value measured using UTM equipment.

In addition, reliability evaluation was evaluated by MG when the peel strength (kgf/cm) of the circuit pattern was less than 0.6.

TABLE 1

| roughness of circuit pattern(Ra, mm) | Embodiment 1 (peel strength, kgf/cm) | Comparative Example 1 (peel strength, kgf/cm) |
|---|---|---|
| 0.1 | 0.65 | 0.37 |
| 0.2 | 0.72 | 0.41 |
| 0.3 | 0.73 | 0.45 |
| 0.4 | 0.74 | 0.52 |
| 0.5 | 0.78 | 0.60 |
| 0.6 | 0.81 | 0.67 |

TABLE 2

| roughness of circuit pattern(Ra, mm) | Embodiment 1 (reliability, peeling or not) | Comparative Example 1 (reliability, peeling or not) |
|---|---|---|
| 0.1 | OK | NG |
| 0.2 | OK | NG |
| 0.3 | OK | NG |
| 0.4 | OK | NG |
| 0.5 | OK | NG |
| 0.6 | OK | OK |

Referring to Tables 1 and 2, it can be seen that the circuit board according to embodiment 1 has improved reliability compared to the circuit board according to Comparative Example 1. In detail, the circuit board according to embodiment 1 forms a circuit pattern in which a coating layer is coated on an insulating layer. Accordingly, as the coating layer is chemically tightly bonded to the insulating layer and the circuit pattern, the peel strength of the circuit pattern can be increased, and accordingly, it can be seen that the adhesion of the circuit pattern and the reliability of the circuit board can be improved. That is, it can be seen that the circuit board according to the embodiment 1 can have an adhesive force that can secure the reliability of the circuit board even when the roughness of the circuit pattern is reduced. In detail, it can be seen that the circuit board according to the embodiment 1 may have an adhesive force capable of securing the reliability of the circuit board even when the surface roughness of the circuit pattern is 0.5 or less or in the range of 0.1 to 0.5. That is, the circuit board according to the first embodiment can reduce the illuminance of the circuit pattern when applied to high-frequency applications, and accordingly, it is possible to reduce the transmission loss due to the skin effect, and even with a low surface roughness, the reliability of the circuit pattern can be secured by improving the adhesion of the circuit pattern by the coating layer. On the other hand, a circuit pattern is formed directly on the insulating layer in the case of the circuit board according to Comparative Example 1. Accordingly, it can be seen that the adhesive force of the circuit pattern, that is, the peel strength, is very low as the insulating layer and the circuit pattern are formed of different materials.

That is, it can be seen that, in the circuit board according to Comparative Example 1, reliability can be secured only when the surface roughness of the circuit pattern is increased, and when the circuit pattern has a low surface roughness, the reliability of the circuit board is reduced.

Therefore, when the circuit board according to Comparative Example 1 is applied to a high frequency application, it can be seen that the transmission loss is increased by a skin effect caused by the surface roughness of the circuit pattern.

Embodiment 2

A copper layer was formed on the insulating layer.

Then, the copper layer was patterned to form a circuit pattern, thereby manufacturing a circuit board.

At this time, the insulating was formed by putting Tricyclodecane-based di-acrylate in which an acrylate is linked to polyphenyl ether (PPE) and tricyclodecane in a toluene solvent, mixing at a temperature of about 100° C., and adding an Azo compound initiator and a peroxide initiator.

Then, the dielectric constant, reliability, and coefficient of thermal expansion of the insulating layer according to the weight ratio of the polyphenylether (A) and tricyclodecane based di-acrylate (B) were measured by varying the frequency size.

TABLE 3

| weight ratio of A and B | Dk | | | Df | | |
|---|---|---|---|---|---|---|
| | 1 GHz | 500 MHz | 100 MHz | 1 GHz | 500 MHz | 100 MHz |
| 8:2 | 2.53 | 2.54 | 2.52 | 0.018 | 0.016 | 0.016 |
| 6:4 | 2.13 | 2.15 | 2.20 | 0.012 | 0.011 | 0.011 |
| 4:6 | 2.03 | 2.04 | 2.08 | 0.008 | 0.007 | 0.007 |
| 2:8 | 3.06 | 3.15 | 3.4 | 0.043 | 0.049 | 0.046 |

TABLE 4

| weight ratio of A and B | coefficient of thermal expansion (ppm/° C.) |
|---|---|
| 6:4 | 35 |
| 4:6 | 39 |

TABLE 5

| weight ratio of A and B | Reliability evaluation |
|---|---|
| 8:2 | NG (cracking) |
| 6:4 | OK |
| 4:6 | OK |
| 2:8 | NG (cracking) |

Referring to Tables 3 to 5, the insulating layer according to the embodiment has a low dielectric constant and a coefficient of thermal expansion when polyphenyl ether (A) and tricyclodecane based di-acrylate (B) satisfy a ratio of 4:6 to 6:4, and it can be seen that the reliability is improved by the improved mechanical strength. On the other hand, when the insulating layer does not satisfy the ratio of polyphenyl ether (A) and tricyclodecane based di-acrylate (B), mechanical strength may decrease and cracks may occur in the insulating layer, it can be seen that the dielectric constant is increased, making it unsuitable for use as an insulating layer of a circuit board for high frequency applications.

Meanwhile, the thickness of each insulating layer constituting the second insulating portion 120 and the third insulating portion 130 of the embodiment may be reduced by providing a part of the second insulating portion 120 and all of the third insulating portion 130 with RCC and the remaining part of the second insulating portion 120 with solder resist.

FIGS. 10 to 15 are views showing a method of manufacturing of a circuit board according to the embodiment shown in FIG. 1 in order of process.

Referring to FIG. 10, the embodiment may preferentially proceed with a process of manufacturing an inner layer substrate of a circuit board. The inner layer substrate may include a first insulating portion 110.

That is, the embodiment may preferentially proceed with a process of preparing an insulating layer including prepreg and a process of forming vias 150 in the insulating layer formed of the prepreg to fabricate the inner layer substrate.

In addition, the embodiment may proceed with a process of forming the circuit pattern 140 on the surface of the insulating layer composed of the prepreg. In this case, the process of manufacturing the inner layer substrate as described above is a known technique in a technical field to which the present invention belongs, and therefore, a detailed description thereof will be omitted.

Next, referring to FIG. 11, the embodiment may proceed with a process of stacking a fifth insulating layer 121 and a seventh insulating layer 131 on the upper and lower surfaces of the inner layer substrate. The fifth insulating layer 121 and the seventh insulating layer 131 may each be composed of the above-described RCC.

And, the embodiment may proceed with a process of forming a circuit pattern 140 on the upper surface of the fifth insulating layer 121 and the upper surface of the seventh insulating layer 131, respectively.

In addition, the embodiment may proceed with a process of forming vias 150 in each of the fifth insulating layer 121 and the seventh insulating layer 131.

Meanwhile, the circuit pattern formed on the upper surface of the fifth insulating layer 121 may include a first pad 160 that is a mounting pad on which the electronic component 300 is mounted.

Referring to FIG. 12, the embodiment may proceed with a process of forming a sixth insulating layer SR1 on the fifth insulating layer 121 and forming an eighth insulating layer 132 under the seventh insulating layer 131.

In this case, the sixth insulating layer SR1 is a solder resist. In addition, the sixth insulating layer SR1 may be formed in two layers in consideration of the fact that it is difficult to form a desired height with one layer.

That is, the sixth insulating layer SR1 may include a plurality of layers. Specifically, the sixth insulating layer SR1 includes a first-first sub solder resist SR1-1 disposed on an upper surface of the fifth insulating layer 121 and a first-second sub solder resist SR1-2 on an upper surface of the first-first sub solder resist SR1-1. That is, the sixth insulating layer SR1 is formed of solder resist, and accordingly, the sixth insulating layer SR1 must have a certain thickness to form vias and circuit patterns. However, there is a limit to forming the solder resist to a certain thickness or more as a single layer, and flatness problems may occur even if the solder resist is provided as a single layer.

Therefore, when the sixth insulating layer SR1 is formed of a solder resist, the embodiment provides the sixth insulating layer SR1 in two layers to solve the above problem.

Meanwhile, the eighth insulating layer 132 may be composed of RCC. That is, a copper foil layer ML may be provided on the lower surface of the eighth insulating layer 132.

Next, referring to FIG. 13, the embodiment may proceed with a process of forming via holes VH in the sixth insulating layer SR1 and the eighth insulating layer 132.

In addition, the embodiment may proceed with a process of forming a first open region OR1 exposing the surface of the first pad 160 in the sixth insulating layer SR1.

That is, the sixth insulating layer SR1 may include a first open region OR1 exposing the first pad 160 of the circuit patterns disposed on the upper surface of the fifth insulating layer 121. The first open region OR1 may be formed in a recess shape. That is, a general open region is formed in a hole shape. For example, when an open region is formed in the sixth insulating layer SR1, the open region of a comparative example has a hole shape exposing an upper surface of the fifth insulating layer 121. Alternatively, the first open region OR1 in the embodiment may be formed covering an entire upper surface of the fifth insulating layer 121 while selectively exposing the upper surface of the first pad 160. For example, a height of an upper surface of the sixth insulating layer SR1 in the first open region OR1 in the embodiment may be positioned higher than a height of the upper surface of the fifth insulating layer 121 and may be positioned lower than a height of the upper surface of the first pad 160.

Next, as shown in FIG. 14, the embodiment may proceed with a process of forming vias and circuit patterns on the sixth insulating layer SR1 and the eighth insulating layer 132.

In addition, the embodiment may proceed with a process of forming a second solder resist SR2 protecting the lower surface of the eighth insulating layer 132 on the lower surface of the eighth insulating layer 132.

Next, as shown in FIG. 15, the embodiment may proceed with a process of disposing solder paste 200 on the first pad 160 exposed through the first open region OR1 of the sixth insulating layer SR1 and a process of mounting the electronic component 300 using the solder paste 200.

An embodiment allows a part of an insulating layer constituting a circuit board to be made of a solder resist. Here, the solder resist may also be a type of insulating layer. However, the insulating layer meant in the embodiment may refer to a layer in which circuit patterns are disposed and vias electrically connecting circuit patterns disposed on different layers to each other are disposed therein. In other words, the insulating layer in the embodiment means a layer in which circuit patterns are disposed and vias are disposed therein. In addition, the solder resist may refer to a protective layer that protects a surface of the insulating layer. Here, the embodiment allows the insulating layer to be formed using a solder resist that functions to protect the surface of the insulating layer. Accordingly, the embodiment may remove the solder resist disposed on an outermost side, and reduce a thickness of the circuit board by a thickness corresponding to this.

In addition, the embodiment forms an open region in the solder resist to form a cavity in which an electronic component is mounted. Accordingly, the embodiment may allow electronic components to be mounted in an open region opened through the solder resist, accordingly an overall thickness of the circuit board may be reduced by a depth of the open region, and thus slimming may be achieved.

The circuit board according to the embodiment may include a buffer layer disposed between the insulating layer and the circuit pattern. That is, the buffer layer of the circuit board according to the embodiment may be formed on the surface of the circuit pattern or on the insulating layer. The buffer layer may be disposed between the insulating layer and the circuit pattern to improve adhesion between the insulating layer and the circuit pattern.

That is, the insulating layer and the circuit pattern are heterogeneous materials including a resin material and a metal, respectively, and when the circuit pattern is formed on the insulating layer, there is a problem that adhesion is reduced.

Accordingly, adhesion between the insulating layer and the circuit pattern may be improved by disposing the buffer layer chemically bonded to the insulating layer and the circuit pattern between the insulating layer and the circuit pattern.

That is, the buffer layer includes a plurality of functional groups coupled to the insulating layer and the circuit pattern, the functional groups are chemically bonded to the insulating layer and the circuit pattern by a covalent bond or a coordination bond, and thereby adhesion between the insulating layer and the circuit pattern may be improved.

Accordingly, even when the surface roughness of the insulating layer is reduced, it is possible to secure adhesion reliability between the insulating layer and the circuit pattern.

Therefore, when the circuit board according to the embodiment is used for high frequency applications, ae transmission loss of the high-frequency signal can be reduced as the surface roughness of the circuit pattern is lowered, and even if the surface roughness of the circuit pattern is lowered, adhesion between the insulating layer and the circuit pattern can be secured by the buffer layer, and thus overall reliability of the circuit pattern can be secured.

In addition, the circuit board according to the embodiment may include an insulating layer having improved strength with a low dielectric constant and a low coefficient of thermal expansion.

In detail, the insulating layer includes a first material and a second material having a low dielectric constant and improved strength, and the first material may be disposed inside the network structure of the second material in the insulating layer, and thus phase separation between the first material and the second material may be prevented. Accordingly, the insulating layer may be formed of the first material and the second material in a single phase, and thus, strength of the insulating layer may be improved.

That is, it is possible to increase a free volume, that is, molecular motion, of the second material having a network structure by cross-linking, and it can be structured so that polymer chains having a network structure are not closely arranged, and accordingly, the first material and the second material may be formed to have a single phase in the insulating layer as the first material is partially disposed inside the network structure.

Accordingly, when the circuit board according to the embodiment is used for high-frequency applications, it is possible to reduce the transmission loss of the high-frequency signal by reducing the dielectric constant of the insulating layer, and the overall reliability of the circuit board can be secured by improving the coefficient of thermal expansion and mechanical strength of the insulating layer.

In addition, the circuit board according to the embodiment may replace a part of a conventional insulating layer including glass fibers by including an insulating layer having a low dielectric constant and a low coefficient of thermal expansion. Specifically, the circuit board according to the embodiment may remove the glass fiber included in some of a plurality of insulating layers. Specifically, the circuit board according to the embodiment can easily adjust the dielectric constant and the coefficient of thermal expansion of the insulating layer using resin and filler constituting RCC (Resin Coated Copper), accordingly, an overall thickness of the circuit board can be reduced by providing the insulating layer with RCC that does not contain conventional glass fibers. Furthermore, the circuit board according to the embodiment is made of an insulating layer having a low coefficient of thermal expansion, therefore, it is possible to remove the core layer for securing strength and reduce the thickness of the insulating layer, and accordingly, it is possible to provide an insulating layer having a thickness smaller than a thickness of the circuit pattern.

FIG. 16 is a view showing a circuit board according to a second embodiment.

Referring to FIG. 16, the circuit board 1000A may include an insulating substrate including first to third insulating portions, a first pad 160, a second pad 170, solder pastes 200 and 400, and an electronic component 300 and 500.

The insulating substrate may be composed of an insulating portion including a plurality of insulating layers.

The insulating portion may include a first insulating portion 110 composed of prepreg, a second insulating portion 120 disposed on the first insulating portion 110 and composed of a mixed layer structure of RCC and solder resist, and a third insulating portion 130A disposed under the first insulating portion 110 and having a mixed layer structure of RCC and solder resist.

In this case, the second embodiment may differ from the first embodiment in that the layer structure of the third insulating portion 130A is composed of a mixed layer structure of RCC and solder resist.]

That is, the first insulating portion and the second insulating portion of the second embodiment are substantially the same as the first insulating portion and the second insulating portion shown in FIG. 1, and a detailed description thereof will be omitted.

The third insulating portion 130A of the second embodiment may include a seventh insulating layer 131 and an eighth insulating layer SR2A.

In this case, the eighth insulating layer of the first embodiment is composed of RCC, but the eighth insulating layer SR2A of the second embodiment may be composed of solder resist.

The eighth insulating layer SR2A may have a two-layer structure similar to the sixth insulating layer SR1. For example, the eighth insulating layer SR2A may include a second-first sub solder resist SR2-1 and a second-second sub solder resist SR2-2.

In addition, a second open region OR2 may be formed in the eighth insulating layer SR2A. In this case, a circuit pattern formed on the lower surface of the seventh insulating layer 131 includes a second pad 170 on which the second electronic component 500 is to be disposed. In addition, a second open region OR2 of the eighth insulating layer SR2A may be formed exposing a lower surface of a second pad 170.

In this case, the RCC may be composed of two layers in a laminated structure of the circuit board in the embodiment. That is, the RCC may include the fifth insulating layer 121 and the seventh insulating layer 131 in the laminated structure of the circuit board according to the second embodiment.

FIG. 17 is a view showing a circuit board according to a third embodiment.

Referring to FIG. 17, a circuit board 1000B may include an insulating substrate including first to third insulating parts, a first pad 160, a solder paste 200, and an electronic component 300.

The insulating substrate may be composed of an insulating portion including a plurality of insulating layers.

The insulation portion may include a first insulating portion 110A composed of prepreg, a second insulating portion 120 disposed on the first insulating portion 110 and composed of solder resist, and a third insulating portion 130B disposed under the first insulating portion 110 and composed of RCC.

In this case, the first insulating portion in the first embodiment included four layers of prepreg. However, the first insulating portion of the third embodiment may be composed of two layers of prepreg. Accordingly, the first insulating portion of the third embodiment may include only the first insulating layer 111a and the second insulating layer 112a.

In addition, the third insulating portion in the first embodiment is composed of two layers of RCC, and the third insulating portion in the third embodiment may be composed of three layers of RCC. Accordingly, the third insulating portion of the third embodiment may include a sixth insulating layer 131B, a seventh insulating layer 132B, and a eighth insulating layer 133B.

In this case, the second insulating portion 120 of the third embodiment may be composed of one layer of RCC and two layers of solder resist.

The second insulating portion 130 according to the third embodiment may include a third insulating layer 121, a fourth insulating layer SR1A, and a fifth insulating layer SR1B.

In the embodiment, the first insulating portion is composed of two layers of prepreg and the third insulating portion is composed of three layers of RCC in order to constitute the second insulating portion with two layers of solder resist, and accordingly, reliability was secured.

In addition, a first pad 160B is disposed on an upper surface of the third insulating layer 121.

In addition, each of the fourth insulating layer SR1A and the fifth insulating layer SR1B may be formed of a solder resist. That is, the second insulating portion in the third embodiment includes two layers of solder resist.

Accordingly, the fourth insulating layer SR1A of the embodiment may have a multi-layer structure. That is, the fourth insulating layer SR1A of the third embodiment is made of solder resist, and accordingly, it may consist of two layers of solder resists SR1-1A and SR1-2A. Similarly, the fifth insulating layer SR1B may also be formed of two layers of solder resists SR1-1B and SR1-2B.

Meanwhile, an open region where an electronic component in the third embodiment is mounted may be formed in the fourth insulating layer SR1A and the fifth insulating layer SR1B. That is, the open region in the first embodiment is formed in only one insulating layer, but, the open region OR1 in the third embodiment may be formed by opening two insulating layers in common. Accordingly, the open region OR1 in the third embodiment may include a first portion formed on the fourth insulating layer SR1A and a second portion formed on the fifth insulating layer SR1B.

An embodiment allows a part of an insulating layer constituting a circuit board to be made of a solder resist. Here, the solder resist may also be a type of insulating layer. However, the insulating layer meant in the embodiment may refer to a layer in which circuit patterns are disposed and vias electrically connecting circuit patterns disposed on different layers to each other are disposed therein. In other words, the insulating layer in the embodiment means a layer in which circuit patterns are disposed and vias are disposed therein. In addition, the solder resist may refer to a protective layer that protects a surface of the insulating layer. Here, the embodiment allows the insulating layer to be formed using a solder resist that functions to protect the surface of the insulating layer. Accordingly, the embodiment may remove the solder resist disposed on an outermost side, and reduce a thickness of the circuit board by a thickness corresponding to this.

In addition, the embodiment forms an open region in the solder resist to form a cavity in which an electronic component is mounted. Accordingly, the embodiment may allow electronic components to be mounted in an open region opened through the solder resist, accordingly an overall thickness of the circuit board may be reduced by a depth of the open region, and thus slimming may be achieved.

The circuit board according to the embodiment may include a buffer layer disposed between the insulating layer and the circuit pattern. That is, the buffer layer of the circuit board according to the embodiment may be formed on the surface of the circuit pattern or on the insulating layer. The buffer layer may be disposed between the insulating layer and the circuit pattern to improve adhesion between the insulating layer and the circuit pattern.

That is, the insulating layer and the circuit pattern are heterogeneous materials including a resin material and a metal, respectively, and when the circuit pattern is formed on the insulating layer, there is a problem that adhesion is reduced.

Accordingly, adhesion between the insulating layer and the circuit pattern may be improved by disposing the buffer layer chemically bonded to the insulating layer and the circuit pattern between the insulating layer and the circuit pattern.

That is, the buffer layer includes a plurality of functional groups coupled to the insulating layer and the circuit pattern, the functional groups are chemically bonded to the insulating layer and the circuit pattern by a covalent bond or a coordination bond, and thereby adhesion between the insulating layer and the circuit pattern may be improved.

Accordingly, even when the surface roughness of the insulating layer is reduced, it is possible to secure adhesion reliability between the insulating layer and the circuit pattern.

Therefore, when the circuit board according to the embodiment is used for high frequency applications, ae transmission loss of the high-frequency signal can be reduced as the surface roughness of the circuit pattern is lowered, and even if the surface roughness of the circuit pattern is lowered, adhesion between the insulating layer and the circuit pattern can be secured by the buffer layer, and thus overall reliability of the circuit pattern can be secured.

In addition, the circuit board according to the embodiment may include an insulating layer having improved strength with a low dielectric constant and a low coefficient of thermal expansion.

In detail, the insulating layer includes a first material and a second material having a low dielectric constant and improved strength, and the first material may be disposed inside the network structure of the second material in the insulating layer, and thus phase separation between the first material and the second material may be prevented. Accordingly, the insulating layer may be formed of the first material and the second material in a single phase, and thus, strength of the insulating layer may be improved.

That is, it is possible to increase a free volume, that is, molecular motion, of the second material having a network structure by cross-linking, and it can be structured so that polymer chains having a network structure are not closely arranged, and accordingly, the first material and the second material may be formed to have a single phase in the insulating layer as the first material is partially disposed inside the network structure.

Accordingly, when the circuit board according to the embodiment is used for high-frequency applications, it is possible to reduce the transmission loss of the high-frequency signal by reducing the dielectric constant of the insulating layer, and the overall reliability of the circuit board can be secured by improving the coefficient of thermal expansion and mechanical strength of the insulating layer.

In addition, the circuit board according to the embodiment may replace a part of a conventional insulating layer including glass fibers by including an insulating layer having a low dielectric constant and a low coefficient of thermal expansion. Specifically, the circuit board according to the embodiment may remove the glass fiber included in some of a plurality of insulating layers. Specifically, the circuit board according to the embodiment can easily adjust the dielectric constant and the coefficient of thermal expansion of the insulating layer using resin and filler constituting RCC (Resin Coated Copper), accordingly, an overall thickness of the circuit board can be reduced by providing the insulating layer with RCC that does not contain conventional glass fibers. Furthermore, the circuit board according to the embodiment is made of an insulating layer having a low coefficient of thermal expansion, therefore, it is possible to remove the core layer for securing strength and reduce the thickness of the insulating layer, and accordingly, it is possible to provide an insulating layer having a thickness smaller than a thickness of the circuit pattern.

The characteristics, structures, effects, and the like described in the above-described embodiments are included in at least one embodiment, but are not limited to only one embodiment. Furthermore, the characteristic, structure, and effect illustrated in each embodiment may be combined or modified for other embodiments by a person skilled in the art. Therefore, it should be construed that contents related to such combination and modification are included in the scope of the embodiment.

Embodiments are mostly described above, but the embodiments are merely examples and do not limit the embodiments, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the embodiment defined in the following claims.

What is claimed is:

1. A circuit board comprising:
an insulating portion including a plurality of insulating layers;
a circuit pattern disposed on a surface of at least one insulating layer among the plurality of insulating layers; and
a via passing through at least one insulating layer among the plurality of insulating layers;
wherein the insulating portion includes:
a first insulating portion including at least one insulating layer, including a first insulating material; and
a second insulating portion disposed on the first insulating portion,
wherein the second insulating portion includes:
a first layer disposed on the first insulating portion and including a second insulating material different from the first insulating materials; and
a second layer disposed on the first layer and including a third insulating material different from the first and second insulating materials,
wherein the circuit pattern includes a first circuit pattern disposed on the second layer of the second insulating portion;
wherein the via includes a first via passing through the second layer of the second insulating portion and electrically connected to the first circuit pattern; and
wherein the second layer of the second insulating portion is a solder resist.

2. The circuit board of claim 1, wherein the first insulating portion includes a prepreg including glass fibers, and
wherein the first layer of the second insulating portion includes a resin coated copper (RCC).

3. The circuit board of claim 1, further comprising:
a third insulating portion disposed under the first insulating portion;
wherein the third insulating portion includes:
a third layer disposed under the first insulating portion and including the second insulating material; and
a fourth layer disposed under the third layer of the third insulating portion and including the third insulating material.

4. The circuit board of claim 3, wherein the circuit pattern includes a second circuit pattern disposed under a lower surface of the third layer of the third insulating portion; and
wherein the via includes a second via passing through the third layer of the third insulating portion and electrically connected to the second circuit pattern; and
wherein the second circuit pattern and the second via are disposed at a lowermost side in a laminated structure of the first to third insulating portions.

5. The circuit board of claim 4, wherein the circuit pattern includes a first pad disposed on the first layer of the second insulating portion;
wherein the second layer of the second insulating portion includes a first open region exposing an upper surface of the first pad.

6. The circuit board of claim 5, wherein an upper surface of the second layer of the second insulating portion in the first open region is higher than an upper surface of the first layer of the second insulating portion and lower than an upper surface of the first pad.

7. The circuit board of claim 5, wherein the second layer of the second insulating portion includes:
a second-first layer disposed on the first layer of the second insulating portion; and
a second-second layer disposed on the second-first layer of the second insulating portion.

8. The circuit board of claim 7, wherein a thickness of each of the second-first and second-second layers of the second insulating portion is smaller than a thickness of the first layer of the second insulating portion.

9. The circuit board of claim 7, wherein a thickness of the fourth layer of the third insulating portion is smaller than a thickness of the second layer of the second insulating portion.

10. The circuit board of claim 9, wherein the fourth layer of the third insulating portion is provided as a single layer.

11. The circuit board of claim 3, wherein the circuit pattern includes a third circuit pattern disposed under the fourth layer of the third insulating portion;
   wherein the via includes a third via passing through the fourth layer of the third insulating portion and electrically connected to the third circuit pattern.

12. The circuit board of claim 11, wherein the circuit pattern includes:
   a first pad disposed on the first layer of the second insulating portion; and
   a second pad disposed under the third layer of the third insulating portion;
   wherein the second layer of the second insulation portion includes a first open region exposing an upper surface of the first pad; and
   wherein the fourth layer of the third insulating portion includes a second open portion exposing a lower surface of the second pad.

13. The circuit board of claim 12, wherein the second layer of the second insulating portion includes:
   a second-first layer disposed on the first layer of the second insulating portion; and
   a second-second layer disposed on the second-first layer of the second insulating portion,
   wherein the fourth layer of the third insulating portion includes:
   a fourth-first layer disposed under the third layer of the third insulating portion; and
   a fourth-second layer disposed under the fourth-first layer of the third insulating portion.

14. The circuit board of claim 12, wherein an upper surface of the second layer of the second insulating portion in the first open region is positioned higher than an upper surface of the first layer of the second insulating portion and lower than an upper surface of the first pad; and
   wherein a lower surface of the fourth layer of the third insulating portion in the second open region is positioned lower than a lower surface of the third layer of the third insulating portion and higher than a lower surface of the second pad.

15. The circuit board of claim 3, wherein the first insulating material includes glass fibers, and
   wherein the second insulating material and the third insulating material do not include glass fibers.

16. The circuit board of claim 7, wherein the first via commonly passes through the second-first layer and the second-second layer of the second insulating portion.

17. The circuit board of claim 13, wherein the first via commonly passes through the second-first layer and the second-second layer of the second insulating portion; and
   wherein the third via commonly passes through the fourth-first layer and the fourth-second layer of the third insulating portion.

* * * * *